United States Patent [19]
Santo et al.

[11] Patent Number: 5,354,392
[45] Date of Patent: Oct. 11, 1994

[54] METHOD FOR CONNECTING A WIRING ARRANGED ON A SHEET WITH ANOTHER WIRING ARRANGED ON ANOTHER SHEET BY ULTRASONIC WAVES

[75] Inventors: Kouichi Santo, Osaka; Naohiro Nishioka, Kyoto; Kenji Otomo; Kouji Tanabe, both of Osaka; Futoshi Matsui, Tsuyama, all of Japan

[73] Assignee: Matsushita Electric Industrial Co., Ltd., Osaka, Japan

[21] Appl. No.: 3,913

[22] Filed: Jan. 13, 1993

[30] Foreign Application Priority Data

Jan. 24, 1992 [JP] Japan ................................. 4-010681
Jan. 27, 1992 [JP] Japan ................................. 4-011690

[51] Int. Cl.⁵ ............................................. B32B 31/16
[52] U.S. Cl. ................................... 156/73.1; 156/291; 156/292; 156/308.4; 156/311; 156/580.1; 264/23; 228/110.1; 29/830; 29/832
[58] Field of Search ................... 156/73.1, 73.4, 311, 156/580.1, 580.2, 291, 292, 295, 308.4; 264/23; 228/1.1, 110.1; 29/830, 832

[56] References Cited

U.S. PATENT DOCUMENTS

| | | | |
|---|---|---|---|
| 3,886,012 | 5/1975 | Slater | 156/73.1 |
| 4,554,033 | 11/1985 | Dery et al. | 29/832 X |
| 5,058,800 | 10/1991 | Yoshizawa et al. | 228/110.1 X |

FOREIGN PATENT DOCUMENTS

| | | |
|---|---|---|
| 61-114419 | 6/1986 | Japan . |
| 63-262894 | 10/1988 | Japan . |
| 360095 | 3/1991 | Japan . |
| 4186697 | 7/1992 | Japan . |

Primary Examiner—David A. Simmons
Assistant Examiner—J. Sells
Attorney, Agent, or Firm—Lowe, Price, LeBlanc & Becker

[57] ABSTRACT

A method for electrically connecting an upper wiring with a lower wiring consists of the steps of arranging the upper wiring mixed with thermo-softening material on an upper insulating sheet, arranging the lower wiring mixed with thermo-softening material on a lower insulating sheet, putting the upper insulating sheet on the lower insulating sheet to bring the upper wiring into contact with the lower wiring, and providing ultrasonic vibration to the upper and lower wirings and the upper insulating sheet while pushing the upper insulating sheet toward the lower insulating sheet. In these steps, the upper and lower wirings and the upper insulating sheet are heated and melted because friction heat is generated by the ultrasonic vibration. Thereafter, the upper insulating sheet is pushed into the upper and lower wirings while pushing these wirings aside and is boded with the lower insulating sheet. Also, the upper wiring is bonded with the lower wiring so that these wirings are electrically connected.

22 Claims, 13 Drawing Sheets

$\theta = 0°$

FIG. 30A

| PITCH L1 OF PRINTED WIRINGS (mm) | PITCH L2, L3 OF PROJECTIONS (mm) | ANGLE θ (degrees) | JUDGEMENT OF ELECTRIC CONDUCTIVITY |
|---|---|---|---|
| 0.3 | 0.05 | 0 | ○ |
|  |  | 22.5 | ○ |
|  | 0.5 | 0 | × |
|  |  | 22.5 | ○ |
|  | 1.0 | 0 | × |
|  |  | 22.5 | ○ |
|  | 2.0 | 0 | × |
|  |  | 22.5 | × |
|  | 3.0 | 0 | × |
|  |  | 22.5 | × |
| 0.5 | 0.05 | 0 | ○ |
|  |  | 22.5 | ○ |
|  | 0.5 | 0 | × |
|  |  | 22.5 | ○ |
|  | 1.0 | 0 | × |
|  |  | 22.5 | ○ |
|  | 2.0 | 0 | × |
|  |  | 22.5 | × |
|  | 3.0 | 0 | × |
|  |  | 22.5 | × |

○ : GOOD
× : NOT GOOD

FIG. 30B

| PITCH L1 OF PRINTED WIRINGS (mm) | PITCH L2, L3 OF PROJECTIONS (mm) | ANGLE θ (degrees) | JUDGEMENT OF ELECTRIC CONDUCTIVITY |
|---|---|---|---|
| 1.0 | 0.05 | 0 | ○ |
| | | 22.5 | ○ |
| | 0.5 | 0 | ○ |
| | | 22.5 | ○ |
| | 1.0 | 0 | × |
| | | 22.5 | ○ |
| | 2.0 | 0 | × |
| | | 22.5 | ○ |
| | 3.0 | 0 | × |
| | | 22.5 | ○ |
| 2.0 | 0.05 | 0 | ○ |
| | | 22.5 | ○ |
| | 0.5 | 0 | ○ |
| | | 22.5 | ○ |
| | 1.0 | 0 | ○ |
| | | 22.5 | ○ |
| | 2.0 | 0 | × |
| | | 22.5 | ○ |
| | 3.0 | 0 | × |
| | | 22.5 | ○ |

○ : GOOD
× : NOT GOOD

METHOD FOR CONNECTING A WIRING ARRANGED ON A SHEET WITH ANOTHER WIRING ARRANGED ON ANOTHER SHEET BY ULTRASONIC WAVES

BACKGROUND OF THE INVENTION

1. Field of the Invention

The present invention relates to a method for connecting a wiring arranged on a sheet with another wiring arranged on another sheet by applying ultrasonic waves and pressure, and, in particular, to a method for connecting wirings arranged on wiring sheets which are put in electronic apparatus such as an audio visual apparatus and an office automation apparatus.

2. Description of the Related Art

Electronic apparatus such as an audio visual apparatus and an office automation apparatus has been recently miniaturized, and the electronic apparatus has recently become light in weight. Therefore, the electronic apparatus can be carried. In contrast, a large number of electronic parts and mechanical parts have been provided to the electronic apparatus at tight packing to fulfill many types of functions. Accordingly, a thin and lightweight type of flexible printed wiring sheet has been recently utilized to print an electronic wiring network to which the electronic parts and the mechanical parts are connected.

Also, the electronic apparatus has become cheap. Therefore, the electronic apparatus must be manufactured at a lower cost. To manufacture the electric apparatus at a lower cost, an electronic wiring network which are printed on the flexible printed wiring sheets or are formed on the wiring boards must be connected at a lower cost.

Conventionally, many types of discrete electronic parts and mechanical parts are directly attached on a single flexible printed wiring sheet so that the sheet is complicated in shape. In this case, the flexible printed wiring sheet is arranged in a narrow opening formed between the parts and an apparatus case accommodating the parts. Therefore, the discrete electronic parts are electrically connected through an electronic wiring network printed on the flexible printed wiring sheet.

Accordingly, even though the electronic parts and the mechanical parts are put in the apparatus case at tight packing, because the flexible printed wiring sheet is thin, the parts can be electrically connected through the electronic wiring network printed on the flexible printed wiring sheet to operate the parts in the equipment case. Also, because the flexible printed wiring sheet is light in weight, the electronic apparatus in which the parts are electrically connected with the electronic wiring network printed on the sheet can be easily carried. In addition, because the sheet is flexible, the sheet can be arbitrarily arranged at a desired position of the equipment case so that the electronic apparatus can be arbitrarily designed.

However, as the electronic apparatus is miniaturized, and as a large number of parts are put in the electronic apparatus at tight packing, the flexible printed wiring sheet becomes more complicated in shape. Also, when a designer requires to arbitrarily design the arrangement of the parts in the electronic apparatus, the flexible printed wiring sheet is more complicated in shape. In this case, because the flexible printed wiring sheet is complicate in shape, the number of the flexible printed wiring sheets cut out from a prescribed size of work sheet is reduced. That is, the flexible printed wiring sheet cannot be efficiently produced. Therefore, there is a drawback that the electronic apparatus cannot be manufactured on a large scale.

Also, after the flexible printed wiring sheet is cut out from the work sheet, it is difficult to handle the flexible printed wiring sheet because the sheet is complicated in shape. Therefore, there is another drawback that the electric apparatus cannot be efficiently manufactured.

To solve the above drawbacks, there is another conventional method in which the complicated shape of flexible printed wiring sheet is divided to a simple shape of many flexible printed wiring sheets. That is, many flexible printed wiring sheets being simple in shape are cut off from the work sheet, and an electronic wiring network is printed on each of the wiring sheets. Thereafter, the simple shape of flexible printed wiring sheets are mechanically connected with one another to electrically connect the electronic wiring networks. Thereafter, the simple shape of flexible printed wiring sheets are arranged in a complicated shape of opening formed between discrete electronic parts. Therefore, the electronic parts and the mechanical parts in the equipment case are electrically connected through the simple shape of flexible printed wiring sheets.

According to circumstances, a stiff type of wiring board is connected with the flexible printed wiring sheet to electrically connect electronic wiring networks in the equipment case.

To connect the simple shape of flexible printed wiring sheets, the flexible printed wiring sheets are, for example, mechanically connected through a sheet connector. However, in this case, there is a drawback that the sheet connector is required as additional equipment. Also, there is another drawback that it is difficult to make up a thin and miniaturized type of electronic apparatus because the sheet connector is not thin and comparatively large.

To solve the above drawbacks, there is still another conventional method in which the simple type of flexible printed wiring sheets are pressed to mechanically connect with one another through an anisotropic conductive coated film by utilizing a heated rubber which is wound up around the sheets. In this case, the anisotropic conductive coated film is sealed between the sheets to electrically connect the electronic wiring networks with each other.

2.1. Previously Proposed Art

A conventional method for electrically connecting wirings printed on flexible wiring sheets through an anisotropic conductive coated film is described with reference to FIGS. 1 & 2.

FIG. 1 is a diagonal view of a connecting section in which insulating sheets and an anisotropic conductive sheet positioned between the insulating sheets are arranged according to a conventional method.

FIG. 2A is a sectional view of the connecting section shown in FIG. 1 in which the anisotropic conductive sheet is sandwiched by wirings printed on the insulating sheets, the wirings being not electrically connected with each other.

FIG. 2B is a sectional view of the connecting section shown in FIG. 1 in which the wirings printed on the insulating sheets are electrically connected with each other through the anisotropic conductive sheet compressed by the insulating sheets.

As shown in FIG. 1, an upper pattern of wirings 11 is printed on an upper insulating sheet 12, and a lower pattern of wirings 13 is printed on a lower insulating sheet 14. Also, an anisotropic conductive sheet 15 is arranged between the upper and lower insulating sheets. The upper and lower insulating sheets 12, 14 and the anisotropic conductive sheet 15 are arranged at a connecting section of flexible printed wiring sheets. In addition, an electric wiring network drawn in one of the flexible printed wiring sheets is electrically connected with the upper wirings 11. Also, another electric wiring network drawn in the other flexible printed wiring sheet is electrically connected with the lower wirings 13.

Thereafter, as shown in FIG. 2A, the anisotropic conductive sheet 15 is sandwiched by the upper and lower insulating sheets 12, 14 through the upper and lower wirings 11, 13. Thereafter, a heated rubber (not shown) is tightly wound up around the upper and lower insulating sheets 12, 14 to press the anisotropic conductive sheet 15. Therefore, the anisotropic conductive sheet 15 is softened by the heat applied by the heated rubber. As a result, as shown in FIG. 2B, parts of anisotropic conductive sheet 15 directly sandwiched between the upper and lower wirings 11, 13 are thinned by the heated rubber. Thereafter, the heated rubber is taken off from the upper and lower insulating sheets 12, 14 so that the anisotropic conductive sheet 15 deformed by the heated rubber is hardened. That is, the upper and lower insulating sheets 12, 14 are mechanically connected through the thinned anisotropic conductive sheet 15. As a result, a pair of connected sheets 16 is made up.

In addition, in cases where the anisotropic conductive sheet 15 is pressed in a direction, the electric resistance of the anisotropic conductive sheet 15 is considerably reduced in the direction because the sheet 15 has anisotropic property.

Accordingly, because the parts of anisotropic conductive sheet 15 directly sandwiched between the upper and lower wirings 11, 13 are pressed, the electric resistance between the upper and lower wirings 11, 13 is considerably reduced so that the upper and lower wirings 11, 13 are electrically connected with each other.

Therefore, a thin and miniaturized type of electronic apparatus can be easily manufactured by utilizing the anisotropic conductive sheet 15.

However, in the above conventional method, the anisotropic conductive sheet 15 is required to make up the connected sheets 16. However, the anisotropic conductive sheet 15 is very expensive because the sheet 15 has anisotropic property. Therefore, there is a drawback that the wirings 11, 13 cannot be electrically connected at lower cost.

In addition, because the heat is transferred from the heated rubber to the anisotropic conductive sheet 15 through the wirings 11, 13, it takes a lot of time to deform the anisotropic conductive sheet 15. For example, it takes from twenty seconds to one minute. Therefore, the connected sheets 16 cannot be rapidly made up. As a result, there is another drawback that the electronic apparatus cannot be manufactured on a large scale.

SUMMARY OF THE INVENTION

A first object of the present invention is to provide, with due consideration to the drawbacks of such a conventional method, a method for connecting wirings arranged on sheets in which the wirings are connected at a cheap cost.

A second object of the present invention is to provide a method for connecting wirings arranged on sheets in which the wirings are rapidly connected.

A third object of the present invention is to provide a method for connecting wirings arranged on sheets in which a thin and miniaturized electronic apparatus is manufactured.

A forth object of the present invention is to provide a method for connecting wirings arranged on sheets in which the sheets are arbitrarily arranged.

A fifth object of the present invention is to provide a method for connecting wirings arranged on sheets in which electronic apparatus is manufactured on a large scale.

The first and second objects are achieved by the provision of a method for electrically connecting an upper wiring with a lower wiring, comprising the steps of:

mixing thermo-softening material with conductive material to make wiring material;

arranging the wiring material on an upper insulating sheet to form the upper wiring;

arranging the wiring material on a lower insulating sheet to form the lower wiring;

putting the upper insulating sheet on the lower insulating sheet to bring the upper wiring into contact with the lower wiring;

providing ultrasonic vibration to the upper and lower wirings and the upper insulating sheet positioned on the upper wiring to melt the upper and lower wirings and the upper insulating sheet by frictional heat while pushing the upper insulating sheet toward the lower insulating sheet;

deforming the upper and lower wirings and the upper insulating sheet to mechanically connect the upper insulating sheet with the lower insulating sheet; and tightly bonding the upper wiring to the lower wiring by cooling the upper and lower wirings to electrically connect the upper wiring with the lower wiring.

In the above steps according to the present invention, the upper and lower wirings and the upper insulating sheet positioned on the upper wiring are melted because the frictional heat is generated by the ultrasonic vibration. Therefore, because the upper insulating sheet is pressed toward the lower insulating sheet through the upper and lower wirings, the upper and lower wirings and the upper insulating sheet are deformed, and the upper insulating sheet is pressed into the lower insulating sheet. As a result, the upper insulating sheet is mechanically connected with the lower insulating sheet.

At the same time, the upper and lower wirings are bonded to each other when the upper and lower wirings are melted. Therefore, when the provision of the ultrasonic vibration is stopped, the upper and lower wirings are cooled and tightly bonded. Therefore, the upper and lower wirings are electrically connected with each other.

Accordingly, because the upper and lower wirings and the upper insulating sheet are pressed and melted by the ultrasonic vibration, the electrical connection between the upper and lower wirings can be quickly achieved.

Also, because any anisotropic conductive sheet is not required, the insulating sheets can be connected at a low cost. In addition, because the upper wiring is directly bonded to the lower wiring, the upper and lower wirings can be reliably and electrically connected with each other.

It is preferred that the step of deforming the upper and lower wirings include:

pushing the upper wiring melted by the frictional heat into the lower wiring melted by the frictional heat to electrically connect the upper wiring with the lower wiring;

forming a hole penetrating the upper and lower wirings while pressing down the upper insulating sheet to push both the lower wiring and the upper wiring aside; and bonding the upper insulating sheet melted by the frictional heat to the lower wiring and the lower insulating sheet facing the hole to mechanically connect the upper insulating sheet with the lower insulating sheet.

In the above step, because the upper wiring is pushed into the lower wiring, the upper and lower wirings are reliably and electrically connected with each other.

Also, because the hole is surrounded by the upper insulating sheet melted by the frictional heat, the upper insulating sheet is attached on the lower wiring and the lower insulating sheet. Therefore, the upper and lower insulating sheets are mechanically connected.

Also, it is preferred that the step of deforming the upper and lower wirings include:

pushing the upper wiring melted by the frictional heat into the lower wiring melted by the frictional heat to electrically connect the upper wiring with the lower wiring;

forming a groove which penetrates the upper and lower wirings and reaches the lower insulating sheet while pressing down the upper insulating sheet to push both the lower wiring and the upper wiring aside;

bonding the upper insulating sheet melted by the frictional heat to the lower wiring and the lower insulating sheet which face the hole to mechanically connect the upper insulating sheet with the lower insulating sheet; and forming an electric shield which surrounds the upper and lower wirings and reaches the lower insulating sheet while pressing down the upper insulating sheet.

In the above step, a pair of upper and lower wirings is surrounded by the electric shield formed of the upper insulating sheet. Therefore, in cases where many pairs of upper and lower wirings are respectively connected, even though one pair of upper and lower wirings is pushed aside, one pair of wirings is not in contact with the other pairs.

Also, it is preferred that the step of arranging the wiring material on an upper insulating sheet include:

arranging an upper thermo-plastic film on the upper insulating sheet; and arranging the wiring material on the upper thermoplastic film to form the upper wiring, and the step of arranging the wiring material on a lower insulating sheet include:

arranging a lower thermo-plastic film on the lower insulating sheet; and arranging the wiring material on the lower thermoplastic film to form the lower wiring, and the step of deforming the upper and lower wirings include:

melting the upper thermo-plastic film to tightly bond the upper wirings to the upper thermo-plastic resin film; and melting the lower thermo-plastic film to tightly bond the lower wirings to the lower thermo-plastic resin film.

In the above steps, even though the upper wirings are vigorously vibrated by the ultrasonic vibration, the upper wirings are not taken off from the upper insulating sheet because the upper thermo-plastic film is promptly and tightly bonded to the upper insulating sheet by the ultrasonic vibration. In the same manner, even though the lower wirings are vigorously vibrated by the ultrasonic vibration, the lower wirings are not taken off from the lower insulating sheet.

Also, the first and second objects are achieved by the provision of a method for electrically connecting an upper wiring with a lower wiring, comprising the steps of:

mixing thermo-setting material with conductive material to make wiring material;

arranging the wiring material on an upper insulating sheet to form a pair of divided upper wirings connected with the upper wiring, an upper groove being formed between the divided upper wirings;

arranging the wiring material on a lower insulating sheet to form a pair of divided lower wirings connected with the lower wiring, a lower groove being formed between the divided lower wirings;

putting the upper insulating sheet on the lower insulating sheet to bring the divided upper wirings into contact with the divided lower wirings, an opening being formed by combining the upper groove and the lower groove;

providing ultrasonic vibration to the upper insulating sheet just above the opening formed between the divided upper wirings to melt the upper insulating sheet by frictional heat while pushing the upper insulating sheet toward the lower insulating sheet;

deforming the upper insulating sheet melted by the frictional heat to mechanically connect the upper insulating sheet with the lower insulating sheet; and tightly bonding the divided upper wirings to the divided lower wirings while contracting the upper insulating sheet melted by the frictional heat.

In the above steps, the upper insulating sheet melted by the frictional heat is pressed down into the opening before the upper insulating sheet is pushed into the lower insulating sheet. Therefore, the upper insulating sheet is mechanically connected with the lower insulating sheet after the upper insulating sheet deformed by the frictional heat is cooled down. In this case, because the divided upper wirings and the divided lower wirings are formed of the thermo-setting material, the wirings are not melted.

Also, because the upper insulating sheet melted by the fractional heat contracts after being cooled, the divided upper wirings are tightly bonded to the divided lower wirings. Therefore, even though the divided upper wirings cannot be tightly bonded to the divided lower wirings by melting the wirings, the divided upper wirings can be electrically connected with the divided lower wirings.

In addition, the divided upper wirings and the divided lower wirings are not vibrated so much because the ultrasonic vibration is not provided to the upper insulating sheet just above the divided upper wirings. Therefore, the divided upper wirings are not taken off from the upper insulating sheet. Also, the divided lower wirings are not taken off from the lower insulating sheet. Accordingly, even though the divided upper wirings and the divided lower wirings are formed of the thermo-setting material, the divided upper wirings can be reliably connected with the divided lower wirings.

The second to fifth objects are achieved by the provision of a method for electrically connecting an upper wiring with a lower wiring, comprising the steps of:

coating a pattern of lower wirings having thermo-softening property on a lower wiring base, the lower wiring being arranged in parallel with one another at a regular pitch, and the lower wiring base being flexible;

coating a pattern of upper wirings arranged in parallel with one another at the regular pitch on an upper wiring base;

coating an insulating film on the upper wiring base and/or the lower wiring base, the insulating film being formed of thermo-plastic resin;

arranging the upper wiring base on the lower wiring base so as to align the upper wirings drawn on the upper wiring base with the lower wirings drawn on the lower wiring base, the upper wirings and the lower wirings facing each other through the insulating film;

mounting the upper and lower wiring bases on a stiff type of supporting base so as to bring the lower wiring base into contact with a large number of projections provided on the supporting base;

applying an ultrasonic vibration horn which generates ultrasonic waves on the upper wiring base to press the upper and lower wiring bases toward the supporting base, the ultrasonic vibration horn having a flat surface;

heating the lower wirings and the insulating film with frictional heat generated by the ultrasonic waves provided from the ultrasonic vibration horn to melt the insulating film and the lower wirings;

bending the lower wiring base and the lower wirings with the projections of the supporting base while pressing the upper and lower wiring bases with the ultrasonic vibration horn;

breaking through the insulating film melt by the frictional heat with the lower wirings bent by the projections to bring the lower wirings into contact with the upper wirings; and cooling and hardening the lower wirings and the insulating film by taking off the ultrasonic vibration horn from the upper wiring base to mechanically connect the upper and lower wiring bases with each other through the insulating film and to electrically connect the upper and lower wirings with each other.

In the above steps, the upper and lower wiring bases are sandwiched between the ultrasonic vibration horn and the supporting base. Therefore, when the upper and lower wiring bases are pressed by the ultrasonic vibration horn, the lower wiring base is bent by the projections of the supporting base because the lower wiring base is flexible. Also, because the lower wirings have the thermo-softening property and because the insulating film is formed of the thermo-plastic resin, the lower wirings and the insulating film are softened and melt by the frictional heat. Therefore, the lower wirings are bent by the projections and break through the insulating film. As a result, the lower wirings are brought into contact with the upper wirings.

Thereafter, when the ultrasonic vibration horn is taken off from the upper wiring base, the lower wirings are hardened and left bent to keep contact with the upper wirings. Also, the insulating film is hardened to hold the lower wirings bent by the projections and to mechanically connect the lower wiring base with the upper wiring base.

Accordingly, the lower wirings can be electrically and reliably connected with the upper wirings.

It is preferred that the step of mounting the upper and lower wiring bases include arranging the projections of the supporting base at a square pitch, the pitch between the projections ranging from 0.05 mm to 2.0 mm, and the regular pitch at which the lower wirings and the upper wirings are arranged ranges from 0.3 mm to 2.0 mm.

In this case, the projections are uniformly arranged under the lower wirings. Therefore, the lower wirings are uniformly connected with the upper wirings.

In addition, it is preferred that the step of mounting the upper and lower wiring bases include arranging the projections on the supporting base to make an angle between the direction of a series of projections arranged in a line and the direction of extending the upper and lower wirings.

In this case, even though some projections are positioned to be out of the lower wirings, the other projections are sure to be positioned just under the lower wirings. Therefore, the lower wirings are reliably bent by the projections.

Also, it is preferred that the upper wiring base be made of a stiff type of wiring board.

In this case, a set of wiring base made of both the upper wiring base and the lower wiring base in which the upper and lower wirings are electrically connected with each other can be strongly made.

Also, it is preferred that the upper and lower wiring bases be respectively made of a flexible printed wiring sheet.

In this case, a set of wiring base made of both the upper wiring base and the lower wiring base in which the upper and lower wirings are electrically connected with each other can be put in a complicated opening.

Also, it is preferred that the step of coating an insulating film include:

dispersing conductive powder into the thermo-plastic resin to make insulating material on condition that the upper and/or lower wirings positioned far from each other are insulated from each other; and coating the insulating material on the upper wiring base and/or the lower wiring base to form the insulating film.

In this case, even though the insulating film remains between the upper and lower wirings when the lower wirings are bent by the projections, the upper and lower wirings can be electrically connected with each other because the insulating film contains the conductive powder and is thinned Also, it is preferred that the step of arranging the upper wiring base include:

transferring both the upper and lower wiring bases to an image recognition device; and aligning the upper wirings coated on the upper wiring base with the lower wirings coated on the lower wiring base according to an image recognition processing.

In this case, both the pattern of upper wirings and the pattern of lower wirings are recognized by the image recognition device before the upper wirings are automatically aligned with the lower wirings according to the image recognition processing.

Therefore, the upper wirings are accurately aligned with the lower wirings so that the lower wirings are reliably connected with the upper wirings when the lower wirings are pushed by the projections.

BRIEF DESCRIPTION OF THE DRAWINGS

The objects, features and advantages of the present invention will be apparent from the following description taken in conjunction with the accompanying drawings, in which:

FIGS. 30A, 30B respectively show experiment results of electric conductivity in tabular form according to the forth embodiment of the second modification.

DETAIL DESCRIPTION OF THE PREFERRED EMBODIMENTS

Preferred embodiments of a method for connecting a wiring arranged on a sheet with another wiring arranged on another sheet by applying ultrasonic waves and pressure according to the present invention are described with reference to drawings.

Figure 1:
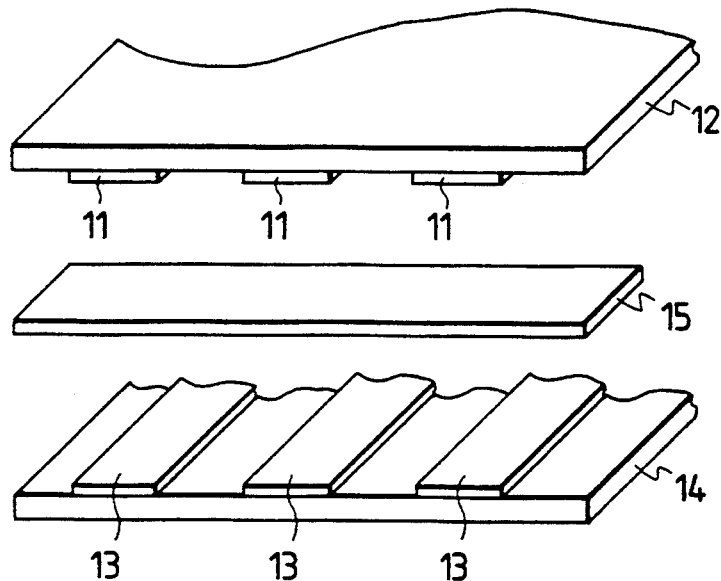
FIG. 1 is a diagonal view of a connecting section in which insulating sheets and an anisotropic conductive sheet positioned between the insulating sheets are arranged according to a conventional method.
Figure 2A:
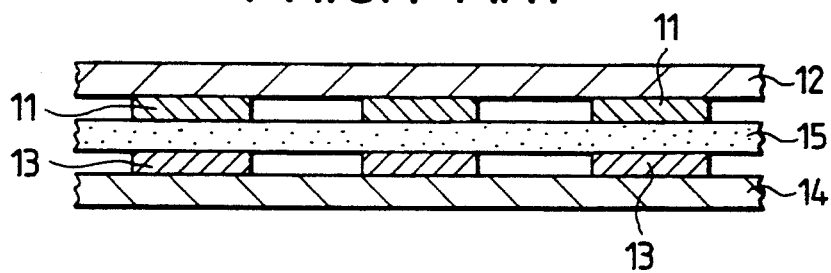
FIG. 2A is a sectional view of the connecting section shown in FIG. 1 in which the anisotropic conductive sheet is sandwiched by wirings printed on the insulating sheets, the wirings being not electrically connected with each other.
Figure 2B:
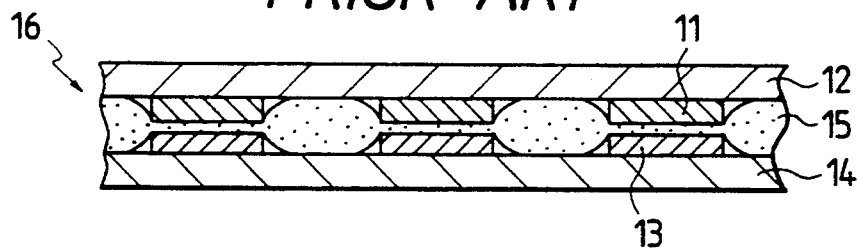
FIG. 2B is a sectional view of the connecting section shown in FIG. 1 in which the wirings printed on the insulating sheets are electrically connected with each other through the anisotropic conductive sheet compressed by the insulating sheets.
Figure 3:
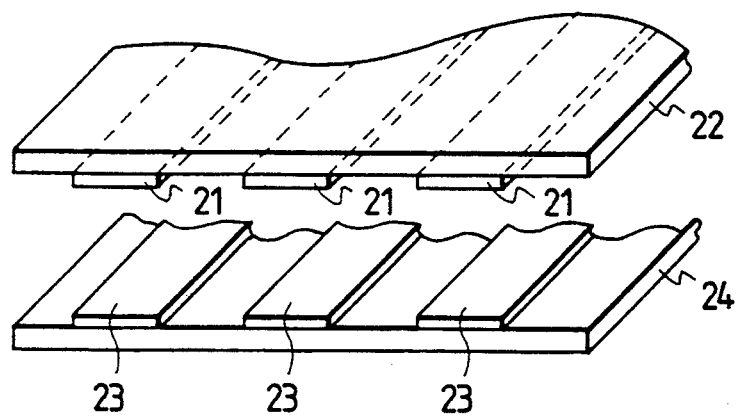
FIG. 3 is a diagonal view of a pair of insulating sheets on which wirings are coated according to a first embodiment of a first modification.

FIG. 3 is a diagonal view of a pair of insulating sheets on which wirings are coated according to a first embodiment of a first modification.

Figure 4:
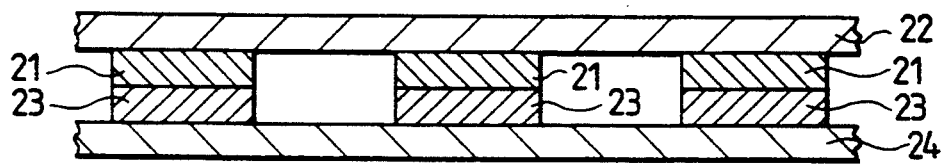
FIG. 4 is a sectional view of the insulating sheets shown in FIG. 3, showing one insulating sheet put on another insulating sheet through the wirings before the insulating sheets are mechanically connected with each other.

FIG. 4 is a sectional view of the insulating sheets shown in FIG. 3, showing one insulating sheet put on another insulating sheet through the wirings before the insulating sheets are mechanically connected with each other.

Initially, conductive material is dispersed into the high molecular thermo-softening material to make wiring material. The conductive material is formed of powdered metal such as copper, nickel, gold, silver, or the like.

Thereafter, as shown in FIG. 3, the wiring metal coated on an upper insulating sheet 22 to form an upper pattern of wirings 21. Also, the wiring metal is coated on a lower insulating sheet 24 to form a lower pattern of wirings 23. Therefore, when the wirings 21, 23 are heated, the wirings 21, 23 are softened and melted. That is, the melted wirings 21, 23 can be deformed by applying heat. Also, the insulating sheets 22, 24 are formed of polyester. Therefore, when the wirings 21, 23 are heated, the insulating sheets 22, 24 are softened.

Thereafter, as shown in FIG. 4, the upper insulating sheet 22 is put on the lower insulating sheet 24 so as to bring the upper wirings 21 coated on the upper insulating sheet 22 in contact with the wirings 23 coated on the lower insulating sheet 24.

Figure 5:
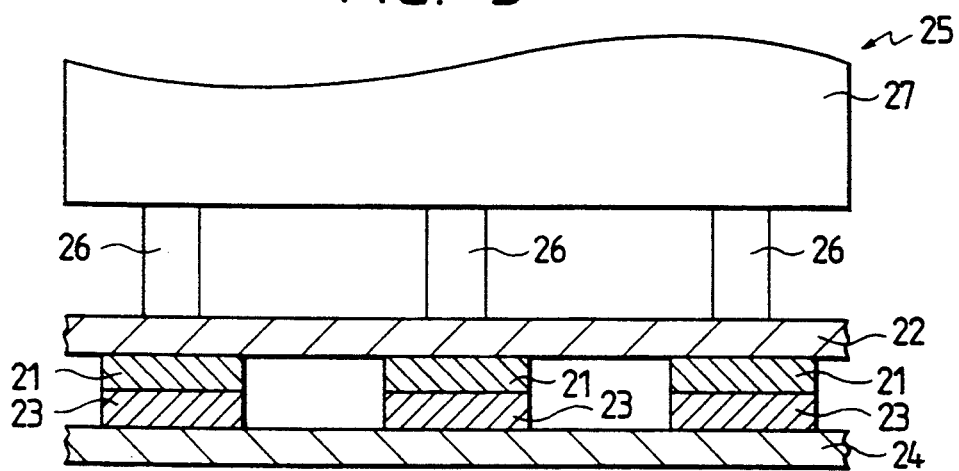
FIG. 5 is a sectional view showing the insulating films shown in FIG. 4 pressed by an ultrasonic vibrator.

FIG. 5 is a sectional view showing the insulating films 22, 24 pressed by an ultrasonic vibrator.

Figure 6:
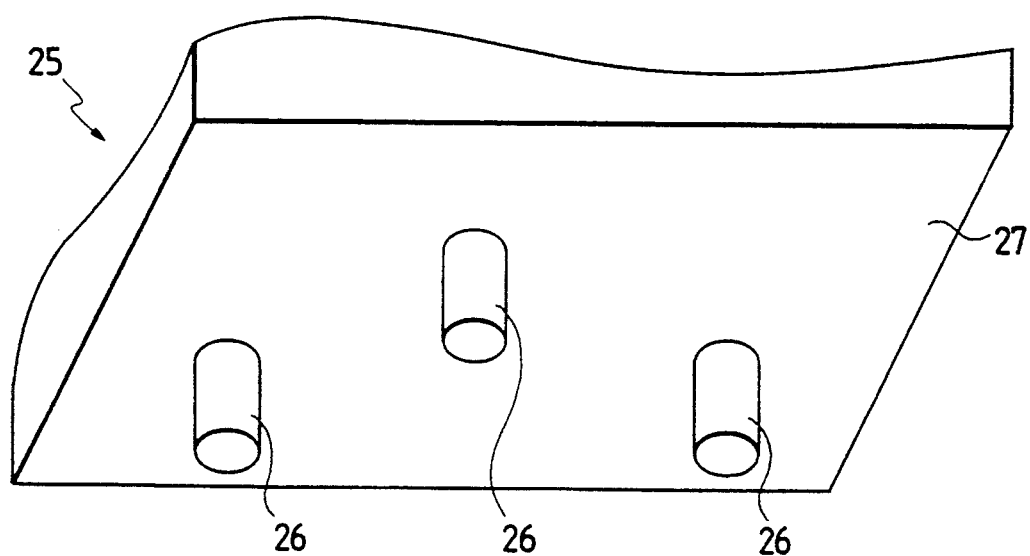
FIG. 6 is a diagonal view of an ultrasonic vibrator utilized for pressing and heating the insulating films shown in FIG. 4.

FIG. 6 is a diagonal view of an ultrasonic vibrator utilized for pressing and heating the insulating Films 22, 24 shown in FIG. 4.

Thereafter, as shown in FIG. 5, the upper insulating sheet 22 is pressed by an ultrasonic vibrator 25. As shown in FIG. 6, the ultrasonic vibrator 25 has a column shape of ultrasonic vibration horns 26 projected on an ultrasonic vibrator base 27. Each of the ultrasonic vibration horns 26 has a flat surface formed of super hard material. When the ultrasonic vibrator 25 is put on the upper insulating sheet 22, portions of the upper insulating sheet 22 just above the upper wirings 21 are pressed by the ultrasonic vibration horns 26. Thereafter, the portions of the upper insulating sheet 22 just above the upper wirings 21 and the wirings 21, 23 are vibrated by receiving ultrasonic waves provided from the ultrasonic vibration horns 26. Therefore, the portions of the upper insulating sheet 22 are strongly rubbed with the flat surfaces of the ultrasonic vibration horns 26, and the wirings 21, 23 are rubbed with each other. As a result, the portions of the upper insulating sheet 22 and the wirings 21, 23 are heated up by frictional heat and are softened.

Figure 7:
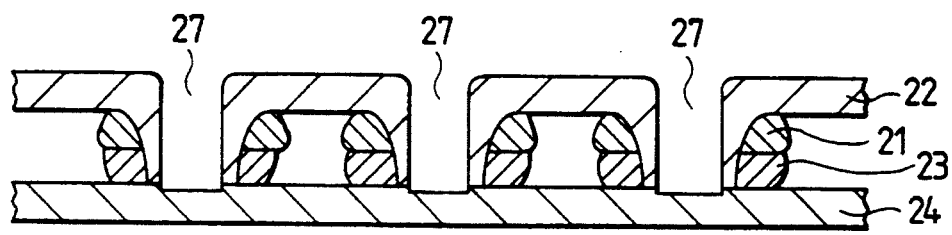
FIG. 7 is a sectional view of insulating sheets deformed by ultrasonic vibration horns shown in FIG. 6 according to the first embodiment of the first modification.
Figure 8:
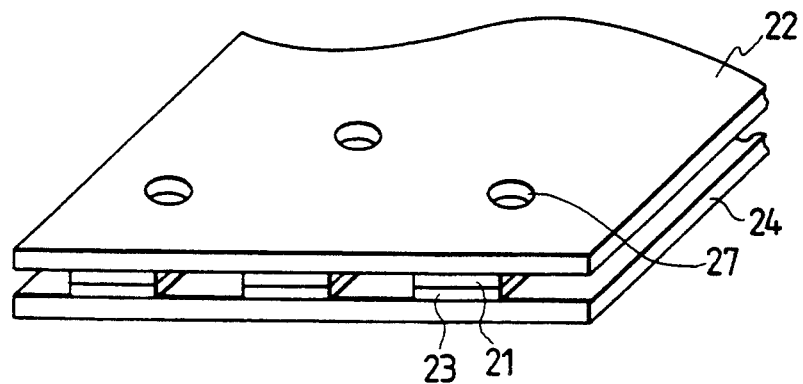
FIG. 8 is a diagonal view of the insulating sheets shown in FIG. 7.

FIG. 7 is a sectional view of the insulating sheets 22, 24 deformed by the ultrasonic vibration horns 26, and FIG. 8 is a diagonal view of the insulating sheets 22, 24 shown in FIG. 7.

Thereafter, because the insulating sheet 22 is pressed by the ultrasonic vibration horns 26, as shown in FIGS. 7 & 8, the upper insulating sheet 22 and the wirings 21, 23 are deformed. In detail, the upper wirings 21 are initially pushed into the lower wirings 23 so that the upper wirings 21 are fully bonded to the lower wirings 22. Thereafter, the upper sheet 22 is pushed down toward the lower sheet 24 by the ultrasonic vibration horns 26 while passing through the center of the upper and lower wirings 21, 23. As a result, the lower wirings 23 and the upper wirings 21 are pushed aside so as to form holes 27 penetrating the center of the wirings 21, 23.

At the same time, the upper insulating sheet 22 melted by the frictional heat is attached on the wirings 21, 23 facing the holes 27 before the upper insulating sheet 22 is brought into contact with the lower insulating sheet 24. Thereafter, the ultrasonic vibration horns 26 are taken off from the insulating sheets 22, 24 so that the insulating sheet 22 and the wirings 21, 23 are cooled and hardened.

Accordingly, the wirings 21 are tightly bonded to the wirings 23 so that; the wirings 21 can be electrically connected with the wirings 23.

Also, because the upper insulating sheet 22 is pushed into the lower insulating sheet 24, the upper insulating sheet 22 can be tightly and mechanically connected with the lower insulating sheet 24.

In addition, because any anisotropic conductive sheet is not utilized, the electrical connection between the wirings 21, 23 can be achieved at lower cost.

Furthermore, because the upper insulating film 22 and the wirings 21, 23 are heated up by the frictional heat while pressing the upper insulating film 22, the upper insulating film 22 and the wirings 21, 23 can be rapidly melted and deformed. Therefore, the insulating sheets 22, 24 can be mechanically connected from each other at a short time.

Still furthermore, because the upper wirings 21 are directly bonded to the lower wirings 23, the upper and lower wirings 21, 23 can be reliably and electrically connected with each other.

In the first embodiment of the first modification, the upper sheet 22 is pressed by the ultrasonic vibration horns 26 toward the lower sheet 24. However, it is preferred that the lower sheet 24 be pressed by the ultrasonic vibration horns 26 toward the upper sheet 22.

Next, a second embodiment of the first modification is described with reference to FIGS. 9 to 12.

Figure 9:
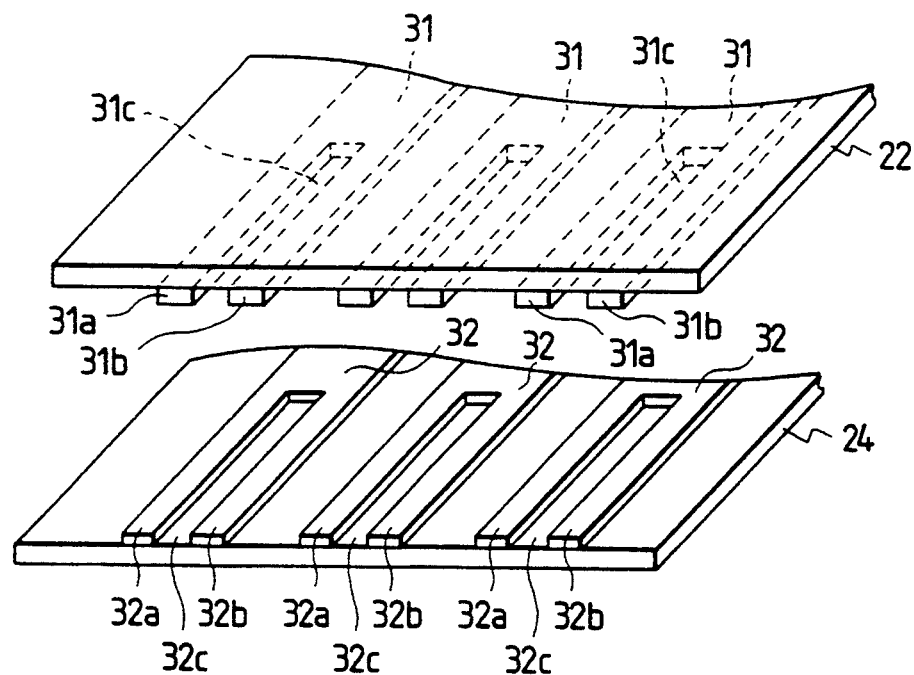
FIG. 9 is a diagonal view of a pair of insulating sheets on which divided wirings are coated according to a second embodiment of the first modification.

FIG. 9 is a diagonal view of a pair of insulating sheets on which divided wirings are coated according to a second embodiment of the first modification.

Figure 10:
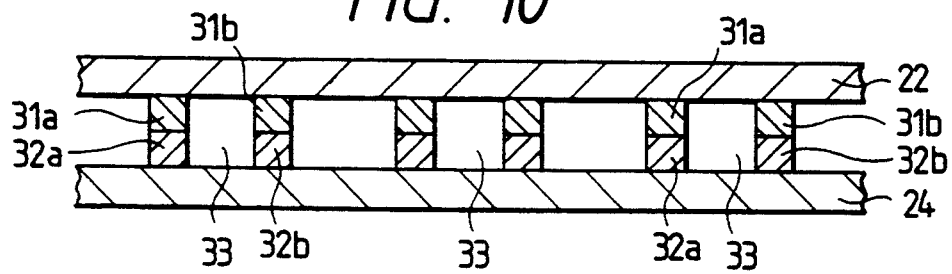
FIG. 10 is a sectional view of the insulating sheets shown in FIG. 9, showing one insulating sheet put on another insulating sheet through the divided wirings before the insulating sheets are mechanically connected with each other.

FIG. 10 is a sectional view of the insulating sheets shown in FIG. 9, showing one insulating sheet put on another insulating sheet through the divided wirings before the insulating sheets are mechanically connected with each other.

Initially, conductive material is dispersed into the high molecular thermo-setting material to make wiring material. The conductive material is formed of powdered metal in the same manner as in the first embodiment. The high molecular thermo-setting material is formed of epoxy resin, phenol resin, or the like.

Thereafter, as shown in FIG. 9, the wiring material is coated on the upper insulating sheet 22 to form an upper pattern of wirings 31, and the wiring metal is coated on the lower insulating sheet 24 to form a lower pattern of wirings 32. Each of the upper wirings 31 branches off to a pair of divided upper wirings 31a, 31b at a connection section of the upper insulating sheet 22. The divided upper wirings 31a, 31b are separated from each other through a groove 31c. Also, each of the lower wirings 32 branches off to a pair of divided lower wirings 32a, 32b at a connection section of the lower insulating sheet 24. The divided lower wirings 32a, 32b are separated from each other through a groove 32c.

Thereafter, as shown in FIG. 10, the upper insulating sheet 22 is put on the lower insulating sheet 24 so as to bring the divided upper wirings 31a, 31b coated on the upper insulating sheet 22 in contact with the divided lower wirings 32a, 32b coated on the lower insulating sheet 24. Openings 33 surrounded by the divided upper wirings 31a, 31b and the divided lower wirings 32a, 32b are formed by combining the grooves 31c, 32c.

Figure 11:
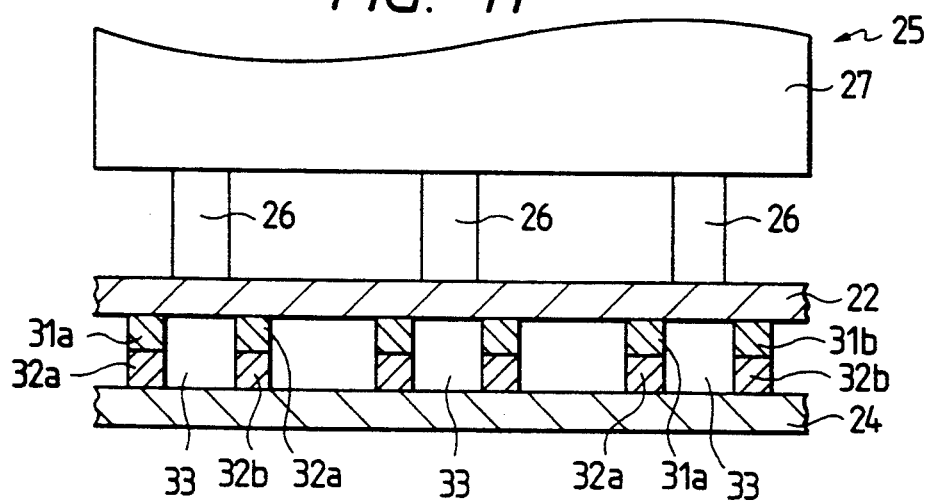
FIG. 11 is a sectional view showing the insulating films shown in FIG. 10 pressed by the ultrasonic vibrator shown in FIG. 6.

Thereafter, as shown in FIG. 11, portions of the upper insulating sheet 22 just above the openings 33 are pressed by the ultrasonic vibration horns 26. In this case, the portions of the upper insulating sheet 22 are softened and melted by the friction heat because the portions of the upper insulating sheet 22 are vibrated by the ultrasonic vibration horns 26. In contrast, the divided upper wirings 31a, 31b and the divided lower wirings 32a, 32b are not vibrated so much because the ultrasonic vibration horns 26 are not positioned just above the divided wirings 31a, 31b, 32a, 32b. Also, the divided wirings 31a, 31b, 32a, 32b are not melted because the divided wirings are formed of the thermo-setting material.

Figure 12:
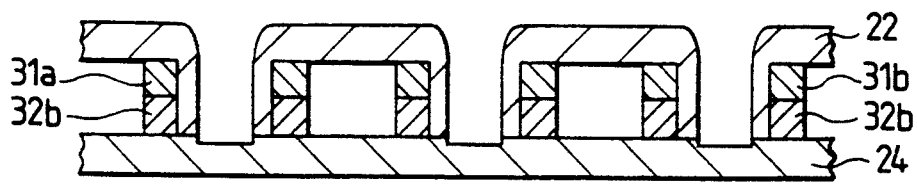
FIG. 12 is a sectional view of insulating sheets deformed by the ultrasonic vibration horns shown in FIG. 6 according to the second embodiment of the first modification.

Therefore, as shown in FIG. 12, the portions of the upper insulating sheet 22 are deformed and the divided wirings 31a, 31b, 32a, 32b are not pushed aside by the ultrasonic vibration horns 26. In detail, the portions of the upper insulating sheet 22 are attached on the side surfaces of the divided wirings 31a, 31b, 32a, 32b facing the openings 33. In addition, the portions of upper insulating sheet 22 are bonded to the lower sheet 24. Thereafter, the ultrasonic vibration horns 26 are taken off so that the portions of upper insulating sheet 22 deformed by the horns 26 are hardened and contract. Therefore, the upper and lower sheets 22, 24 are tightly and mechanically connected with each other. Also, the divided upper and lower wirings 31a, 31b, 32a, 32b are tightly and electrically connected because the portions of upper insulating sheet 22 contract.

Accordingly, even though the divided upper and lower wirings 31a, 31b, 32a, 32b are formed of the thermo-setting material, the divided wirings 31a, 31b, 32a, 32b can be tightly and electrically connected.

Also, because the divided upper and lower wirings 31a, 31b, 32a, 32b are not vibrated so much by the ultrasonic vibration horns 26, the divided wirings 31a, 31b, 32a, 32b are not taken off from the insulating sheets 22, 24. Therefore, any of the divide wirings 31a, 31b, 32a, 32b is not damaged by a divided wiring taken off from the insulating sheet 22 or 24.

Next, a third embodiment of the first modification is described with reference to FIGS. 13 to 15.

Figure 13:
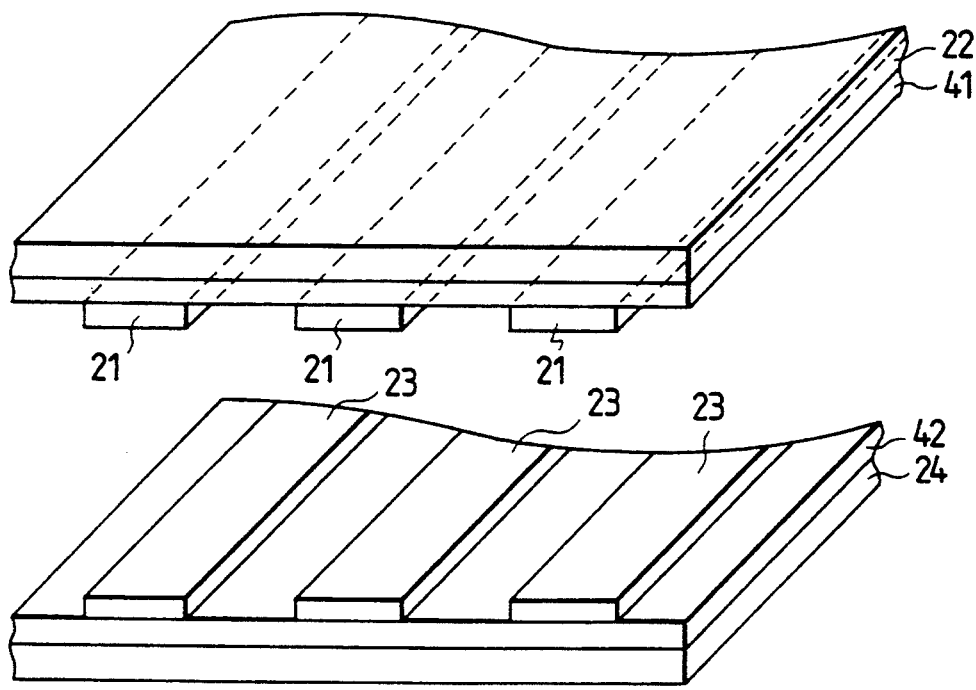
FIG. 13 is a diagonal view of a pair of insulating sheets on which a thermo-plastic resin film and wirings are coated, according to a third embodiment of the first modification.

FIG. 13 is a diagonal view of a pair of insulating sheets on which a thermo-plastic resin film and wirings are coated, according to a third embodiment of the first modification.

Figure 14:
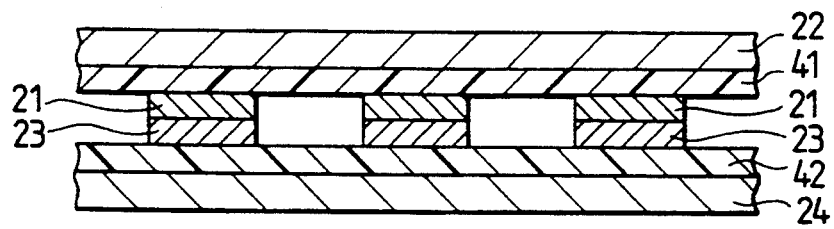
FIG. 14 is a sectional view of the insulating sheets shown in FIG. 13, showing one insulating sheet put on another insulating sheet through the wirings before the insulating sheets are mechanically connected with each other.

FIG. 14 is a sectional view of the insulating sheets shown in FIG. 13, showing one insulating sheet put on another insulating sheet through the wirings before the insulating sheets are mechanically connected with each other.

Initially, the wiring material is made by mixing the conductive material and the high molecular thermo-softening material in the same manner as the first embodiment.

Thereafter, as shown in FIG. 13, an upper thermo-plastic resin film 41 is coated on the upper insulating sheet 22, and the wiring material is coated on the upper thermo-plastic resin film 41 to form the upper pattern of wirings 21. Also, a lower thermo-plastic resin film 42 is coated on the lower insulating sheet 24, and the wiring material is coated on the lower thermo-plastic resin film 42 to form the lower pattern of wirings 23. Therefore, when the upper thermo-plastic resin film 41 is heated, the film 41 has adhesive property so that the wirings 21 tightly adhere to the film 41. Also, when the lower thermo-plastic resin film 42 is heated, the film 42 has adhesive property so that the wirings 23 tightly adhere to the film 42.

Thereafter, as shown in FIG. 14, the upper insulating sheet 22 is put on the lower insulating sheet 24 so as to bring the wirings 21 coated on the upper thermo-plastic resin film 41 into contact with the wirings 23 coated on the lower thermo-plastic resin film 42.

Figure 15:
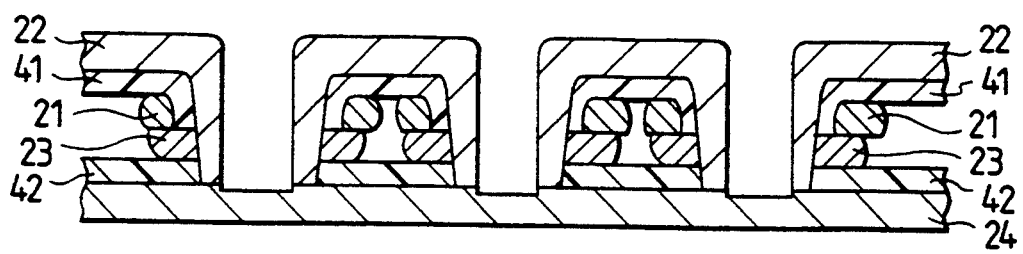
FIG. 15 is a sectional view of insulating sheets deformed by the ultrasonic vibration horns shown in FIG. 6 according to the third embodiment of the first modification.

Thereafter, as shown in FIG. 15, portions of the upper insulating sheet 22 just above the wirings 21 are pressed by the ultrasonic vibration horns 26 in the same manner as in the first embodiment. Therefore, the portions of the upper insulating sheet 22, portions of the upper thermo-plastic resin film 41 just above the wirings 21 and the wirings 21, 23 are heated up by the frictional heat and are melted. Thereafter, the portions of the upper insulating sheet 22, the portions of the upper thermo-plastic resin film 41 and the wirings 21, 23 are deformed. In this case, because the upper and lower thermo-plastic resin films 41, 42 tightly adhere to the upper and lower wirings 21, 23, any of the upper and lower wirings 21, 23 is not taken off from the thermo-plastic resin film 41 or 42.

Accordingly, the wirings 21, 23 can be reliably connected with each other.

Next, a forth embodiment of the first modification described with reference to FIGS. 16 to 18.

Figure 16:
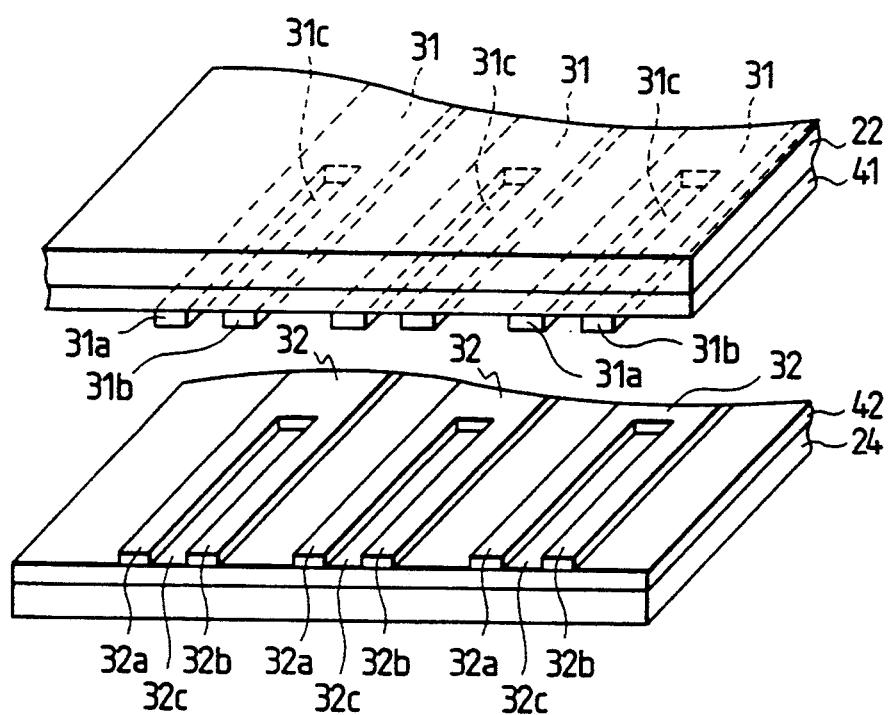
FIG. 16 is a diagonal view of a pair of insulating sheets on which a thermo-plastic resin film and divided wirings are coated, according to a fourth embodiment of the first modification.

FIG. 16 is a diagonal view of a pair of insulating sheets on which a thermo-plastic resin film and divided wirings are coated, according to a forth embodiment of the first modification.

Figure 17:
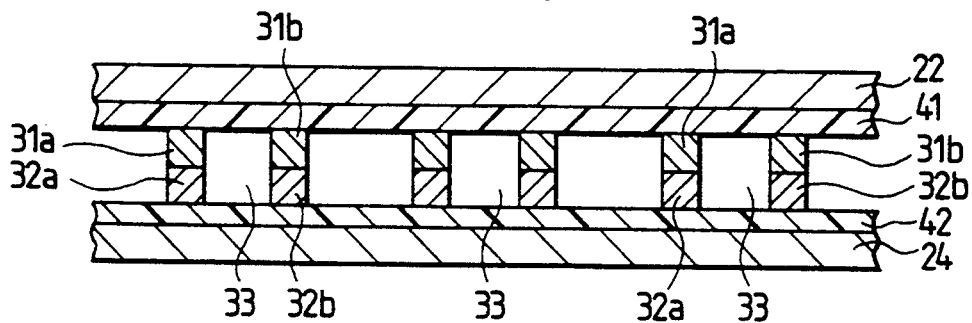
FIG. 17 is a sectional view of the insulating sheets shown in FIG. 16, showing one insulating sheet put on another insulating sheet through the divided wirings before the insulating sheets are mechanically connected with each other.

FIG. 17 is a sectional view of the insulating sheets shown in FIG. 16, showing one insulating sheet put on another insulating sheet through the divided wirings before the insulating sheets are mechanically connected with each other.

As shown in FIG. 16, the upper thermo-plastic resin film 41 is coated on the upper insulating sheet 22, and the divided upper wirings 31a, 31b formed of the thermo-setting conductive material are coated on the upper thermo-plastic resin film 41. Also, the lower thermo-plastic resin film 42 is coated on the lower insulating sheet 24, and the divided lower wirings 32a, 32b formed of the thermo-setting conductive material are coated on the lower thermo-plastic resin film 42.

Thereafter, as shown in FIG. 17, the upper insulating sheet 22 is put on the lower insulating sheet 24 so as to bring the divided upper wirings 31a, 31b coated on the upper thermo-plastic resin film 41 into contact with the divided lower wirings 32a, 32b coated on the lower thermo-plastic resin film 42.

Figure 18:
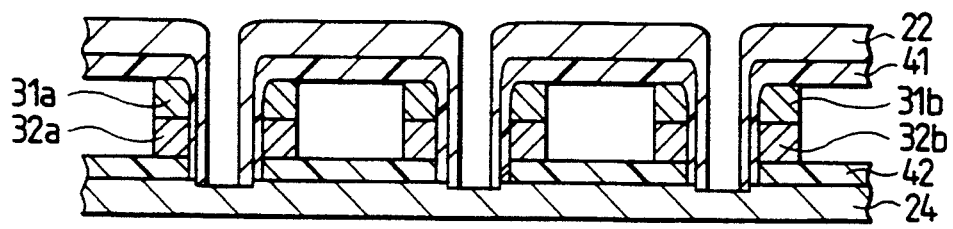
FIG. 18 is a sectional view of insulating sheets deformed by the ultrasonic vibration horns shown in FIG. 6 according to the forth embodiment of the first modification.

Thereafter, as shown in FIG. 18, the upper insulating sheet 22 just above the openings 33 formed between the divided upper wirings 31a, 31b is pressed by the ultrasonic vibration horns 26 in the same manner as in the second embodiment.

Accordingly, the divided upper wirings 31a, 31b are reliably and electrically connected with the divided lower wirings 32a, 32b in the same manner as in the second embodiment.

In addition, even though the divided upper wirings 31a, 31b are undesirably and strongly vibrated by the ultrasonic vibration horns 26, any of the divided upper wirings 31a, 31b is not taken off from the upper thermo-plastic resin film 41 because the upper thermo-plastic resin film 41 tightly adheres to the divided upper wirings 31a, 31b. Also, even though the divided lower wirings 32a, 32b are undesirably and strongly vibrated, any of the divided lower wirings 32a, 32b is not taken off from the lower thermo-plastic resin film 42.

Accordingly, the divided upper wirings 31a, 31b can be reliably connected with the divided lower wirings 32a, 32b.

In the forth embodiment, the sheets 22, 24 are formed of insulating material. However, because the upper and lower thermo-plastic resin films 41, 42 have insulating property, it is preferred that the sheets 22, 24 be formed of conductive material such as metal.

Next, a fifth embodiment of the first modification is described with reference to FIGS. 3, 4, 19, 20 & 21.

As shown in FIGS. 3 & 4, the upper insulating sheet 22 is put on the lower insulating sheet 24 so as to bring the wirings 21 coated on the upper insulating sheet 22 in contact with the wirings 23 coated on the lower insulating sheet 24, in the same manner as in the first embodiment.

Figure 19:
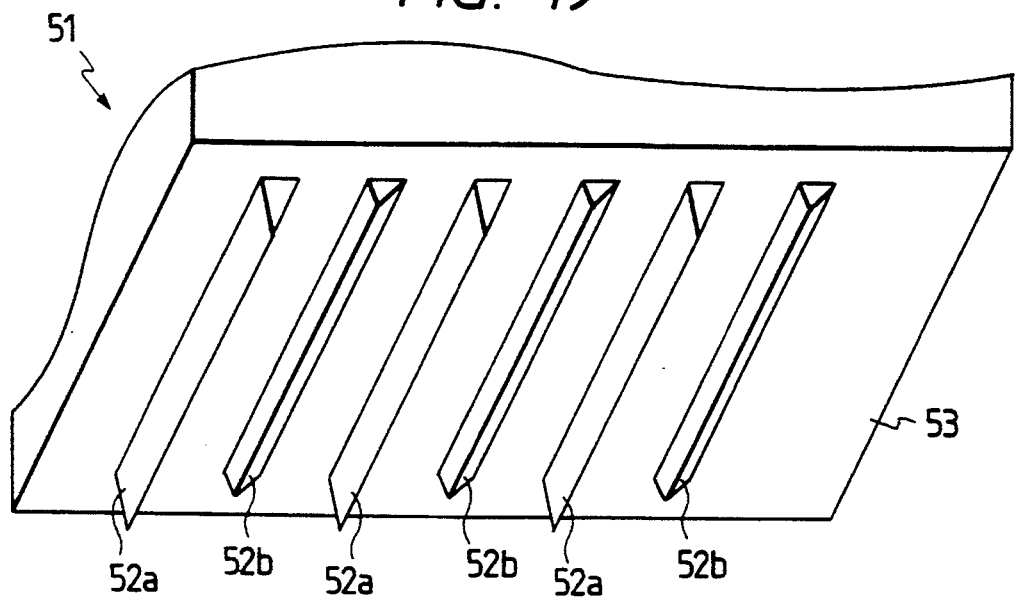
FIG. 19 is a diagonal view of an ultrasonic vibrator.

Thereafter, the upper insulating sheet 22 is pressed by an ultrasonic vibrator 51 shown in FIG. 19. The ultrasonic vibrator 51 has a plurality of ultrasonic vibration horns 52 which laterally extend at a regular interval on a vibrator base 53 and are respectively projected in the form of a V-shaped unit from the vibrator base 53. The surfaces of the ultrasonic vibration horns 52 are formed of super hard material. The interval between the ultrasonic vibration horns 52 is one-half of that between the wirings arranged far from each other. Also, the ultrasonic vibration horns 52 are classified into a wide width type 52a and a narrow width type 52b. These types of ultrasonic vibration horns 52a, 52b are alternately arranged on the vibrator base 53. Therefore, when the upper insulating sheet 22 is pressed by the ultrasonic vibrator 51, the upper insulating sheet 22 just above the wirings 21, 23 is pressed by the wide width type of ultrasonic vibration horns 52a. In contrast, the upper insulating sheet 22 on openings 54 positioned between the wirings arranged far from each other is pressed by the narrow width type of ultrasonic vibration horns 52b.

Figure 20:
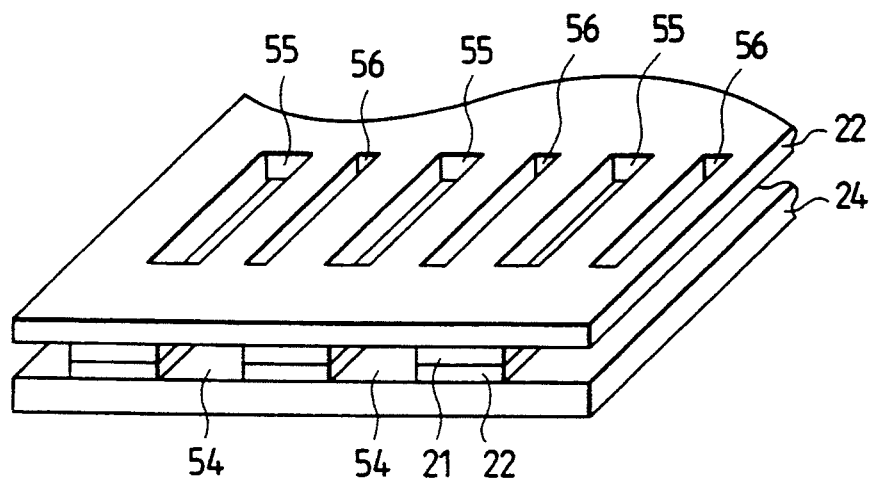
FIG. 20 is a diagonal view of insulating sheets deformed by ultrasonic vibration horns shown in FIG. 19 according to the fifth embodiment of the first modification.
Figure 21:
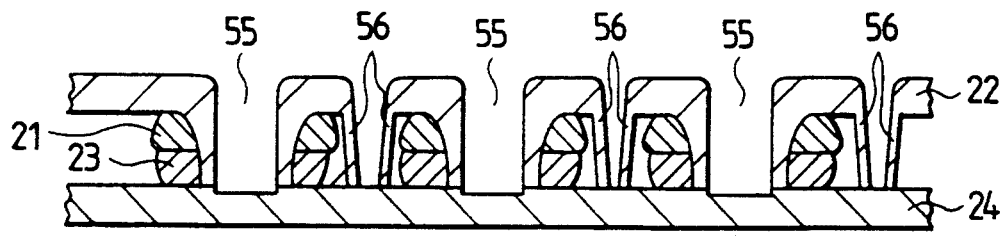
FIG. 21 is a sectional view of insulating sheets deformed by the ultrasonic vibration horns shown in FIG. 19 according to the fifth embodiment of the first modification.

As a result, as shown in FIGS. 20, 21, a V-notch type of wide grooves 55 are formed in the wirings 21, 23 by the frictional heat. Also, V-shaped electric shields 56 which are formed of the upper insulating sheet 22 deformed by the frictional heat are formed in the opening 54. In this case, because the electric shields 56 are formed of the insulating sheet 22, a pair of wirings 21, 23 tightly bonded to each other is reliably separated from the other pairs of wirings 21, 23. Therefore, even though pairs of wirings 21, 23 are pushed aside by the wide type of ultrasonic vibration horns 52a, the pairs of wirings 21, 23 are reliably insulated from one another.

Accordingly, even though the pairs of wirings 21, 23 are closely arranged, the pairs of wirings 21, 23 are reliably insulated from one another. Therefore, the connecting section of each of the insulating sheets can be scaled down so that a miniaturized type of electronic apparatus can be manufactured.

Next, a second modification according to the present invention is described with reference to FIGS. 22 to 29.

Figure 22:
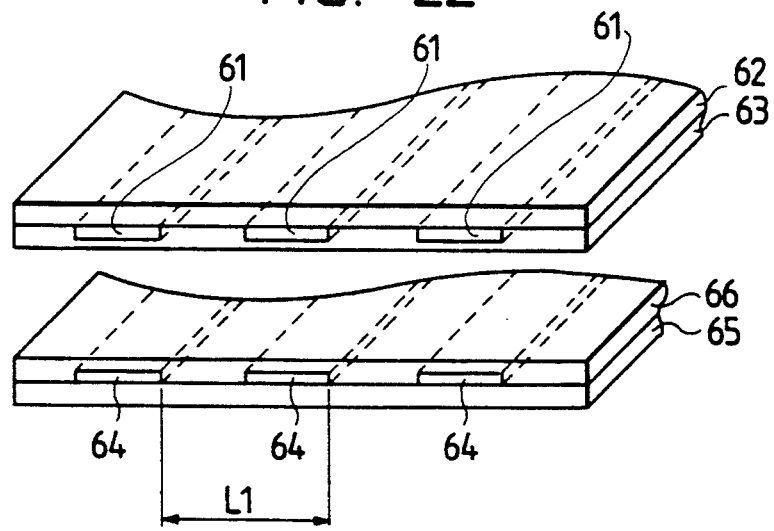
FIG. 22 is a diagonal view of a pair of flexible printed wiring sheets on which wirings are printed according to a second modification of the present invention.

FIG. 22 is a diagonal view of a pair of flexible printed wiring sheets on which wirings are printed according to a second modification of the present invention.

As shown in FIG. 22, a pattern of upper printed wirings 61 is printed on an upper flexible printed wiring sheet 62. The upper printed wirings 61 are arranged in parallel with each other at a regular pitch L1. The upper flexible printed wiring sheet 62 functions as a wiring base. Thereafter, an upper insulating film 63 is coated over the entire upper printed wirings 61 and the upper flexible printed wiring sheet 62. Also, a pattern of lower printed wirings 64 is printed on a lower flexible printed wiring sheet 65. The lower printed wirings 64 are arranged in parallel with each other at the regular pitch L1 in the same manner as the upper printed wirings 61. The regular pitch L1 of the printed wirings 61, 64 generally ranges from 0.8 mm to 2.0 mm. The lower flexible printed wiring sheet 65 also functions as a wiring base. Thereafter, a lower insulating film 66 is coated over the entire lower printed wirings 64 and the lower flexible printed wiring sheet 65.

The upper and lower printed wirings 61, 64 are formed of conductive silver ink. The conductive silver ink is made by densely dispersing powdered silver into ink. The wiring sheets 62, 65 are respectively produced by cutting off a work sheet consisting of a sheet of high polymer film. The insulating films 63, 66 are formed of thermo-plastic resin selected from the group consisting of polyester resin, polyvinyl chloride resin, polyvinyl acetate resin, copolymer of ethylene-vinyl acetate, polyurethane resin, polystyrene resin, and phenoxy resin. In addition, it is preferred that one or more types of rubber selected from the group consisting of such as chloroprene rubber, acrylonitrile rubber, styrene butadiene rubber, natural rubber, and the like be mixed with the thermo-plastic resin to form the insulating films 63, 66. Also, it is preferred that the thermo-plastic resin be denaturated to form the insulating films 63, 66. Furthermore, the thermo-plastic resin is dissolved or dispersed into plasticizer or organic solvent selected from the group consisting of such as isophorone, carbinol, cyclohexane, di-butyl-phthalate, and the like. By dissolving or dispersing the thermo-plastic resin into the plasticizer or the organic solvent, the insulating films 63, 66 can be printed on the wiring sheets 62, 65 according to a screen process printing. If necessary, extender pigment or coloring agent such as titanium oxide, silica, talc, copper phthalocyanine blue, and the like is added to the thermo-plastic resin which is dissolved or dispersed into the plasticizer or the organic solvent.

Figure 23:
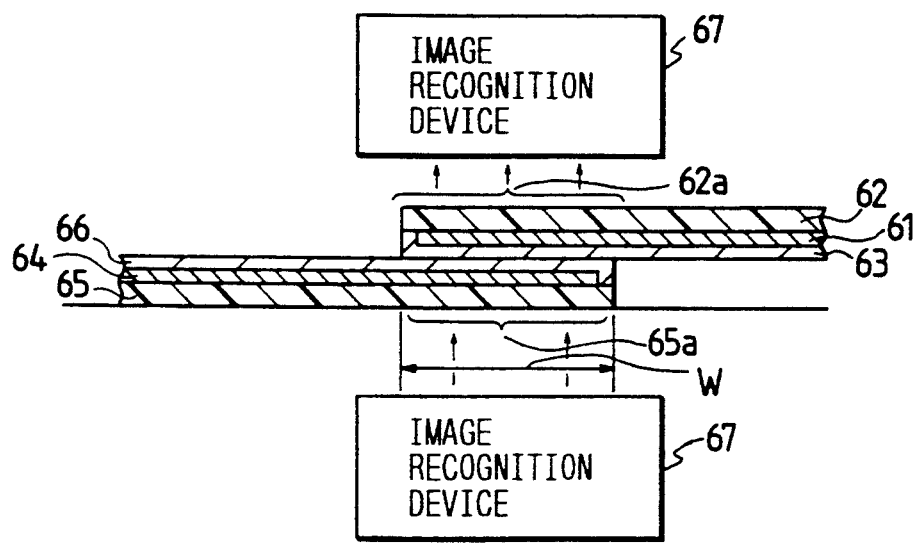
FIG. 23 is a schematical view showing the alignment of the flexible printed wiring sheets shown in FIG. 22.

FIG. 23 is a schematical view showing the alignment of the flexible printed wiring sheets shown in FIG. 22.

Thereafter, as shown in FIG. 23, the printed wiring sheets 62, 65 are transferred to a conventional image recognition device 67 in which the printed wirings 61, 64 printed on the printed wiring sheets 62, 65 are aligned. In detail, a connecting end 62a of the upper flexible printed wiring sheet 62 is put on a connecting end 65a of the lower flexible printed wiring sheet 65 at a connecting width W so as to bring the upper insulating film 63 coated on the upper wiring sheet 62 into contact with the lower insulating film 66 coated on the lower wiring sheet 65. Also, the upper printed wirings 61 are aligned with the lower printed wirings 64 to electrically connect with each other by pressing the printed wirings 61, 64, as described later. That is, the image of the printed wirings 61, 64 are recognized by the image recognition device 67, and the alignment of the printed wirings 61, 64 is automatically accomplished according to an image recognition processing. Therefore, the upper printed wiring 61 and the lower printed wirings 64 face each other through the insulating films 63, 66.

Figure 24:
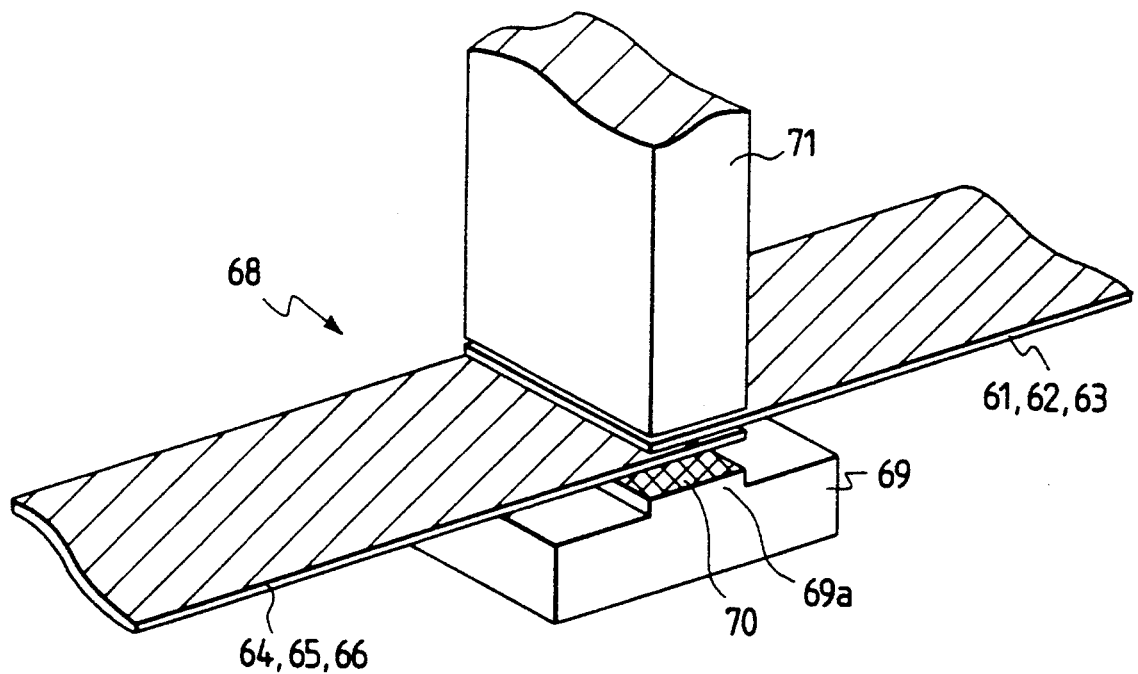
FIG. 24 is a diagonal view of a wiring sheet connecting apparatus for electrically connecting printed wirings printed on flexible printed wiring sheets shown in FIG. 22.

FIG. 24 is a diagonal view of a wiring sheet connecting apparatus for electrically connecting printed wirings printed on flexible printed wiring sheets shown in FIG. 22.

Figure 25:
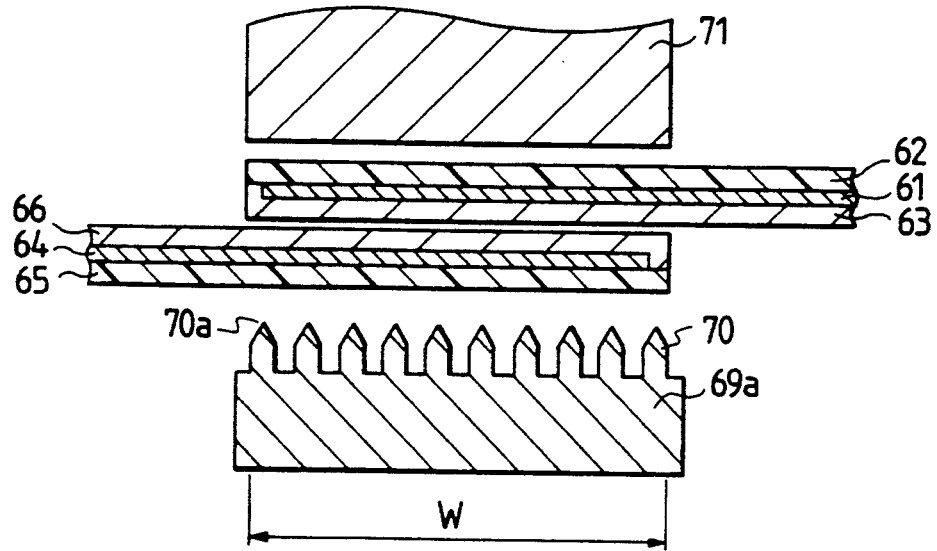
FIG. 25 is a sectional view of the apparatus shown in FIG. 24, showing the wiring sheets not connected by the apparatus.

FIG. 25 is a sectional view of the apparatus shown in FIG. 24, showing the wiring sheets not connected by the apparatus.

Thereafter, as shown in FIGS. 24, 25, the flexible printed wiring sheets 62, 65 are transferred from the image recognition device 67 to a wiring sheet connecting apparatus 68 in which the wiring sheets 62, 65 are mechanically connected with each other and the printed wirings 61, 64 printed on the wiring sheets 62, 65 are electrically connected. In detail, the printed wiring sheets 62, 65 are mounted on a stiff type of supporting base 69.

Figure 26:
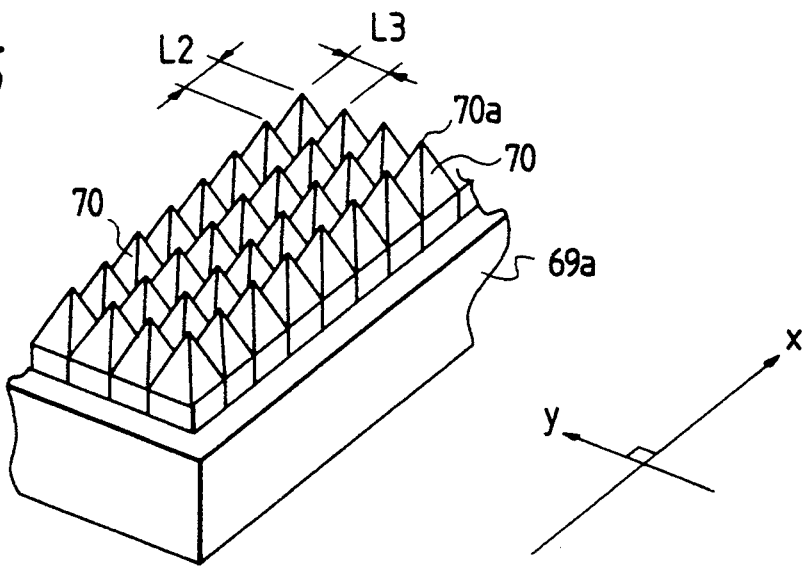
FIG. 26 is a diagonal view of projections arranged on a protruding portion shown in FIG. 24.

FIG. 26 is a diagonal view of projections arranged on a protruding portion shown in FIG. 24.

As shown in FIG. 26, the supporting base 69 has a protruding portion 69a on its surface, and a large number of pyramid type of projections 70 are projected at a rectangular pitch on the entire protruding portion 69a. In detail, the projections 70 are arranged at a regular pitch L2 in an X direction of a series of projections positioned in a line. Also, the projections 70 are arranged at a regular pitch L3 in a Y direction perpendicular to the X direction. Therefore, the projections 70 are uniformly arranged under the lower printed wirings 64. In addition, tips 70a of the projections 70 are positioned on a plane.

Figure 27:
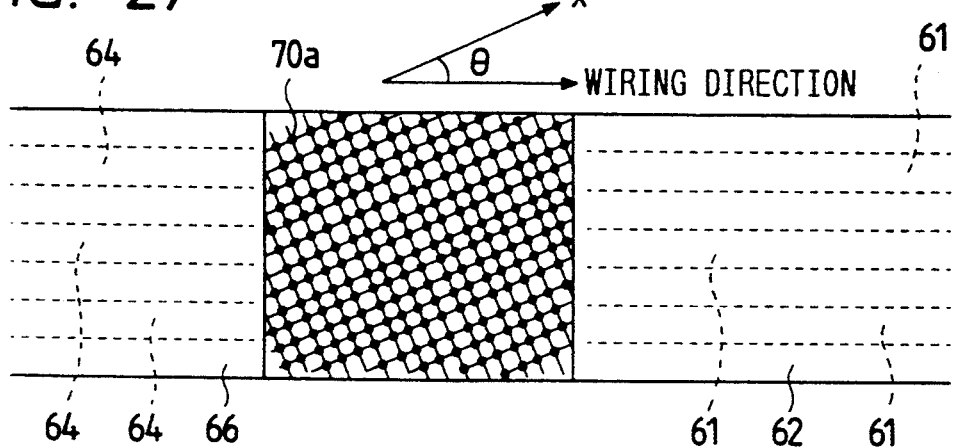
FIG. 27 is a plan view of the wiring sheets mounted on the projections shown in FIG. 26, a given angle $\theta$ being made between an X direction of the projections and an extending direction of the printed wirings according to the second modification.

When the printed wiring sheets 62, 65 are mounted on the supporting base 69, the connecting ends 62a, 65a of the wiring sheets 62, 65 are laid on the projecting portion 69a of the supporting base 69 so as to make a given angle θ between the X direction of the projections 70 and a wiring direction of extending the printed wirings 61, 64, as shown in FIG. 27.

Figure 28:
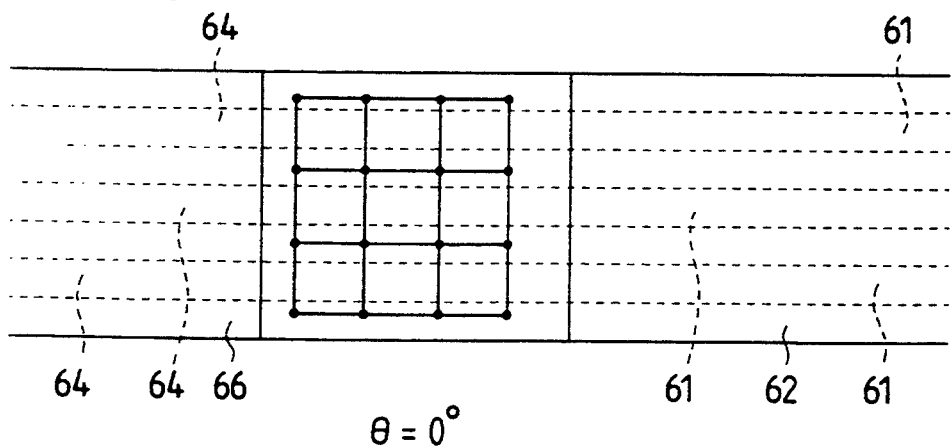
FIG. 28 is a plan view of the wiring sheets erroneously mounted on the projections shown in FIG. 26, the given angle $\theta$ being tentatively set at zero degrees.

Because the X direction of the projections 70 is not the same as the wiring direction of the printed wirings 61, 64, even though the pitch L3 of the projections 70 in the Y direction differs from the pitch L1 of the printed wirings 61, 64, each of the printed wirings are necessarily laid on a large number of tips 70a of the projections 70. In other words, in cases where the wiring sheets 62, 65 are laid on the projecting portion 69a of the supporting base 69 so as to set the X direction of the projections 70 in parallel with the wiring direction of the printed wirings 61, 64, the pitch L3 of the projections 70 must be equal to the pitch L1 of the printed wirings 61, 64 to lay each of the printed wirings 61, 64 on the tips 70a of the projections 70. In addition, the wiring sheets 62, 65 must be laid on the projecting portion 69a of the supporting base 69 so as to accurately lay each of the printed wirings 61, 64 on the tips 70a of the projections 70. Otherwise, each of the printed wirings 61, 64 would not be laid on the tips 70a of the projections 70, as shown in FIG. 28.

The pitch L2 of the projections 70 and the pitch L3 of the projections 70 are respectively a minimum of 0.05 mm in this modification because it is difficult to manufacture the projections 70 of which the pitch is less than 0.05 mm. addition, in cases where the projections 70 is arranged at a pitch less than 0.05 mm, the depth from the tips 70a of the projections 70 to the roots of the projections 70 is not enough for the insulating films 63, 66 to be broken through by the lower printed wirings 64 bent by the projections 70, as described later.

Also, the pitch L2 of the projections 70 and the pitch of the projections 70 are respectively a maximum of 2.0 mm in this modification because the number of the tips 70a of the projections 70 per unit area is not enough to electrically connect the upper printed wirings 61 with the lower printed wirings 64. In other words, in cases where the projections 70 is arranged at a pitch more than 2.0 mm, the connecting sections 62a, 65a of the wiring sheets 62, 65 must be enlarged in area to reliably and electrically connect the upper printed wirings 61 with the lower printed wirings 64. Therefore, design conditions would be undesirably limited.

Thereafter, the connecting sections 62a, 65a of the wiring sheets 62, 65 laid on the supporting base 69 are pressed by an ultrasonic vibration horn 71 from over the upper wiring sheet 62. The ultrasonic vibration horn 71 has a flat surface formed of super hard material. The ultrasonic vibration horn 71 generates ultrasonic waves of which wave frequencies range from 10 kHz to 45 kHz. When the connecting sections 62a, 65a is pressed by the flat surface of the ultrasonic vibration horn 71, the insulating films 63, 66 of the connecting sections 62a, 65a is vibrated by the ultrasonic waves provided from the ultrasonic vibration horn 71 so that the insulating films 63, 66 are heated up by friction heat. Therefore, the insulating films 63, 66 are melted because the insulating films 63, 66 has the thermo-plastic property.

In addition, the printed wirings 61, 64 of the connecting sections 62a, 65a are also vibrated by the ultrasonic waves so that the printed wirings 61, 64 are heated to a temperature of about 100 ° C. by the friction heat. In this case, because the printed wirings 61, 64 are formed of the silver ink, the printed wirings 61, 64 are melted at a temperature of about 100 ° C. Also, the printed wirings 61, 64 are easily and efficiently heated to a temperature of about 100° C. by the frictional heat because a melting point of the printed wirings 61, 64 is lower than that of bulked metal. That is, in cases where the printed wirings 61, 64 are tentatively formed of a sheet of metal film, the printed wirings 61, 64 must be heated to a temperature of about 1000 ° C. to melt the printed wirings 61, 64 by the frictional heat. However, it is impossible to efficiently heat the printed wirings 61, 64 to about 1000 ° C. by only the frictional heat.

Figure 29:
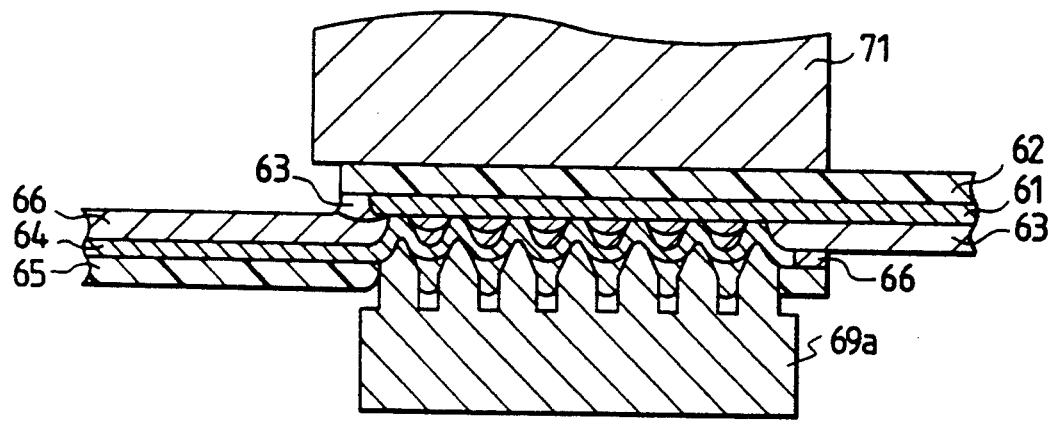
FIG. 29 is a sectional view of the apparatus shown in FIG. 24, showing the wiring sheets mechanically connected by the apparatus.

FIG. 29 is a sectional view of the apparatus shown in FIG. 24, showing the wiring sheets mechanically connected by the apparatus.

As a result, as shown in FIG. 29, because the insulating films 63, 66 and the printed wirings 61, 64 are pressed by the ultrasonic vibration horn 71 and the projections 70, the insulating films 63, 66 are broken through by the lower printed wirings 64 bent by the projections 70. Also, the tips 70a of the projections 70 are set just under the printed lower wirings 64, the lower printed wirings 64 are bent by the projections 70 and are directly brought into contact with the upper printed wirings 61 after breaking through the insulating films 63, 66.

Thereafter, the ultrasonic vibration horn 71 is taken off from the upper wiring sheet 62 to cool the printed wirings 61, 64 and the insulating films 63, 66. Therefore, the printed wirings 61, 64 and the insulating films 63, 66 are hardened so that the insulating films 63, 66 function as maintaining means. That is, the lower printed wirings 64 bent by the projections 70 is left contacted with the upper printed wirings 61 because the hardened insulating films 63, 66 maintain the contact between the printed wirings 61, 64. Therefore, the printed wirings 61, 64 are reliably and electrically connected with each other. Also, because the insulating films 63, 66 formed of the thermo-plastic resin are bonded with each other, the wiring sheets 62, 65 are reliably and mechanically connected with each other.

Accordingly, because the insulating films 63, 65 formed of the thermo-plastic resin are heated and melted by the frictional heat, the insulating films 63, 65 pressed by the ultrasonic vibration horn 71 and the supporting base 69 can be tightly bonded with each other. Therefore, the wiring sheets 62, 65 can be mechanically connected with each other at the connecting sections thereof.

Also, because the connecting sections 62a, 65a of the wiring sheets 62, 65 are laid on the projecting portion 69a of the supporting base 69 so as to make the given angle $\theta$ between the X direction of the projections 70 and the wiring direction of the printed wirings 61, 64, the printed wirings 61, 64 printed on the wiring sheets 62, 65 at the regular pitch L1 can be necessarily laid on a large number of projections 70. In addition, the projections 70 laying on each of the printed wirings 61, 64 is almost uniform in number. Therefore, each of the upper printed wirings 61 can be necessarily and uniformly brought into contact with the lower printed wirings 64 by the projections 70.

Also, because the pitch of the projections 70 arranged on the projection portion 69a of the supporting base 69 ranges from 0.05 mm to 2.0 mm, the upper printed wirings 61 can be reliably and electrically connected with the lower printed wirings 64.

Also, because the printed wirings 61, 64 are formed of the conductive silver ink made by densely dispersing powdered silver into ink, the printed wirings 61, 64 can be melted at a low temperature as compared with bulked metal. Therefore, the printed wirings 61, 64 can be efficiently heated and melted by the frictional heat.

Also, because the connecting sections 62a, 65a of the wiring sheets 62, 65 are pressed by the ultrasonic vibration horn 71 while heating the printed wirings 61, 64 and the insulating films 63, 66, the mechanical connection of the wiring sheets 62, 65 and the electric connection of the printed wirings 61, 64 can be rapidly accomplished.

In the second modification, any metal is not contained in the upper insulating film 63 to insulate one upper printed wiring 61 from the other upper printed wirings 61. However, it is preferred that carbon black or powdered metal such as powdered silver, powdered copper and powdered nickel be dispersed into the insulating film 63 to enhance electric conductivity of the insulating film 63 on condition that the upper printed wirings 61 are insulated from one another. In this case, even though the upper insulating film 63 cannot be fully broken through by the lower printed wirings 64 bent by the projections 70 after the lower insulating film 66 is broken through by the lower printed wirings 64, the lower printed wirings 64 can be electrically connected with the upper printed wirings 61 through the upper insulating film 63 because the upper insulating film 63 remaining between the printed wirings 61, 64 is thinned enough to electrically connect the printed wirings 61, 64 with each other.

Also, the upper wiring sheet 62 is flexible in the second modification. However, because the upper wiring sheet 62 is not deformed by either the ultrasonic vibration horn 71 or the projections 70 of the supporting base 69, it is preferred that the upper wiring sheet 62 be made of a stiff type of wiring board with insulation performance. In this case, the wiring board functions as a wiring base.

Also, the upper printed wirings 61 is formed of the conductive silver ink in the second modification. However, because it is not necessary that the upper printed wirings 61 are melted, it is preferred that the upper printed wirings 61 be formed of bulked metal foil.

Also, it is preferred that the wiring sheets 62, 65 be mounted on the ultrasonic vibration horn 71 before the wiring sheets 62, 65 are pressed by the supporting base 69 from over the upper wiring sheet 62.

Next, a first embodiment of the second modification is described.

The conditions that the second modification is fulfilled according to the first embodiment is as follows.

The flexible printed wiring sheets 62, 65 are respectively formed of polyester film having a thickness of 75 $\mu$m. The conductive silver ink (products No. DX-250H manufactured by TOUYOUBOU Inc. in Japan) is adopted as the printed wirings 61, 64. The printed wirings 61, 64 are printed according to the screen process printing at the regular pitch L1=0.6 mm. The width of the printed wirings 61, 64 is 0.3 mm. Insulating ink with thermo-plasticity (products No. XB-803A manufactured by FUJIKURA KASEI Inc. in Japan) is adopted as the insulating films 63, 66 and is printed on the printed wirings 61, 64 according to the screen process printing. The supporting base 69 is made of iron, and the pitches L2, L3 of the projections 70 are respectively 0.5 mm. The given angle $\theta$ between the X direction of the projections 70 and the wiring direction of the printed wirings 61, 64 is set at 22.5 degrees. The connecting width W of the connecting sections is 5 mm. The wiring sheets 62, 65 are pressed by the ultrasonic vibration horn 71 at a pressure 2 kg/cm$^2$ on condition that the frequency of the ultrasonic waves is 20 kHz and the vibration time is 0.2 second.

When the wiring sheets 62, 65 are mechanically connected with each other according to the above conditions, the printed wirings 61, 64 are electrically connected with each other. The electric conductivity is fair to good. As a result, the tensile strength between the wiring sheets 62, 65 is 7.8 kg/cm.

Next, a second embodiment of the second modification is described.

Conditions that the second modification is fulfilled according to the second embodiment is as follows.

The flexible printed wiring sheet 62 is produced by cutting a sheet of polyimide film of which the thickness is 50 $\mu$m. The printed wirings 61 are made of copper foil of which the thickness is 18 $\mu$m. The other conditions are the same as in the first embodiment.

When the wiring sheets 62, 65 are mechanically connected with each other according to the second embodiment of the second modification, the printed wirings 61, 64 are electrically connected with each other. The electric conductivity is fair to good. As a result, the tensile strength between the wiring sheets 62, 65 is 8.2 kg/cm.

Next, a third embodiment of the second modification is described.

Conditions that the second modification is fulfilled according to the third embodiment is as follows.

The wiring sheet 62 is made of a stiff type of wiring board formed of glass epoxyresin of which the thickness is 0.6 mm. The upper printed wirings 61 are made of copper foil of which the thickness is 35 $\mu$m. The insulating film 63 is formed of anisotropic conductive coat (products No. 3370F manufactured by THREE BOND Inc. in Japan) produced by utilizing the screen process printing. The other conditions are the same as in the first embodiment.

When the wiring sheets 62, 65 are mechanically connected with each other according to the third embodiment of the second modification, the printed wirings 61, 64 are electrically connected with each other. The electric conductivity is fair to good. As a result, 180° peel strength between the wiring sheets 62, 65 is 1.6 kg/cm. The 180° peel strength is measured according to 180° peel test regulated by Japanese Industrial Standard (JIS) K6854.

Next, a fourth embodiment of the second modification is described with reference to FIGS. 30A, 30B.

Conditions that the second modification is fulfilled according to the fourth embodiment is as follows.

FIGS. 30A, 30B respectively show experiment results of electric conductivity in tabular form according to the fourth embodiment of the second modification.

As shown in FIGS. 30A, 30B, the pitch L1 of the printed wirings 61, 64 is varied within the range from 0.3 mm to 2.0 mm (four wiring types). The pitches L2, L3 of the projections 70 are set at the same value and are varied within the range from 0.05 mm to 3.0 mm (five projection types). The given angle θ between the X direction of the projections 70 and the wiring direction of the printed wirings 61, 64 is set at zero degrees and 22.5 degrees (two angle types). The other conditions are the same as in the first embodiment.

After the wiring sheets 62, 65 are mechanically connected with each other according to the fourth embodiment of the second modification, electric conductivity between the printed wirings 61, 64 is measured. The experiment results of the electric conductivity are shown in FIGS. 30A, 30B.

As shown in FIGS. 30A, 30B, in cases where the given angle θ is set at 22.5 degrees, the electric conductivity is fair to good when the pitch L1 of the printed wirings 61, 64 ranges from 0.3 mm to 1.0 mm and the pitches L2, L3 of the projections 70 range from 0.05 mm to 1.0 min. Also, the electric conductivity is fair to good when the pitch L1 of the printed wirings 61, 64 ranges from 1.0 mm to 2.0 mm and the, pitches L2, L3 of the projections 70 range from 0.05 mm to 2.0 mm.

In the above embodiments of the second modification, both the insulating films 63, 66 formed of the thermo-plastic ink are printed on the printed wirings 61, 64. However, it is preferred that one of the insulating films 63, 66 be omitted because the printed wirings 64 bent by the projections 70 are insulated from the printed wirings 61 by the other insulated film 63 or 66.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for electrically connecting an upper wiring with a lower wiring, comprising the steps of:
   mixing thermo-softening material with conductive material to make wiring material;
   arranging the wiring material on an upper insulating sheet to form the upper wiring;
   arranging the wiring material on a lower insulating sheet to form the lower wiring;
   putting the upper insulating sheet on the lower insulating sheet to bring the upper wiring into contact with the lower wiring;
   providing ultrasonic vibration to the upper and lower wirings and the upper insulating sheet positioned on the upper wiring to melt the upper and lower wirings and the upper insulating sheet by frictional heat while pushing the upper insulating sheet toward the lower insulating sheet; and
   deforming the upper and lower wirings and the upper insulating sheet to mechanically connect the upper insulating sheet with the lower insulating sheet; and
   tightly bonding the upper wiring to the lower wiring by cooling the upper and lower wirings to electrically connect the upper wiring with the lower wiring.

2. A method according to claim 1 in which the step of deforming the upper and lower wirings includes:
   pushing the upper wiring melted by the frictional heat into the lower wiring melted by the frictional heat to electrically connect the upper wiring with the lower wiring;
   forming a hole penetrating the upper and lower wirings while pressing down the upper insulating sheet to push both the lower wiring and the upper wiring aside; and
   bonding the upper insulating sheet melted by the frictional heat to the lower wiring and the lower insulating sheet facing the hole to mechanically connect the upper insulating sheet with the lower insulating sheet.

3. A method according to claim 1 in which the step of deforming the upper and lower wirings includes:
   pushing the upper wiring melted by the frictional heat into the lower wiring melted by the frictional heat to electrically connect the upper wiring with the lower wiring;
   forming a groove which penetrates the upper and lower wirings and reaches the lower insulating sheet while pressing down the upper insulating sheet to push both the lower wiring and the upper wiring aside;
   bonding the upper insulating sheet melted by the frictional heat to the lower wiring and the lower insulating sheet which face the hole to mechanically connect the upper insulating sheet with the lower insulating sheet; and
   forming an electric shield which surrounds the upper and lower wirings and reaches the lower insulating sheet while pressing down the upper insulating sheet.

4. A method according to claim 1 in which the step of arranging the wiring material on an upper insulating sheet includes:
   arranging an upper thermo-plastic film on the upper insulating sheet; and
   arranging the wiring material on the upper thermo-plastic film to form the upper wiring, and the step of arranging the wiring material on a lower insulating sheet include:
   arranging a lower thermo-plastic film on the lower insulating sheet; and
   arranging the wiring material on the lower thermo-plastic film to form the lower wiring, and the step of deforming the upper and lower wirings include:

melting the upper thermo-plastic film to tightly bond the upper wirings to the upper thermo-plastic resin film; and melting the lower thermo-plastic film to tightly bond the lower wirings to the lower thermo-plastic resin film.

5. A method according to claim 1 in which the step of providing ultrasonic vibration includes pressing the upper insulating sheet just above the upper wiring with a flat surface of a column type of ultrasonic vibration horn which generates ultrasonic waves to provide the ultrasonic vibration to the upper and lower wirings and the upper insulating sheet.

6. A method according to claim 1 in which the step of providing ultrasonic vibration includes pressing the upper insulating sheet just above the upper wiring with an ultrasonic vibration horn which generates ultrasonic waves to provide the ultrasonic vibration to the upper insulating sheet, the ultrasonic vibration horn laterally extending and being projected in a V shape.

7. A method for electrically connecting an upper wiring with a lower wiring, comprising the steps of:

mixing thermo-setting material with conductive material to make wiring material;

arranging the wiring material on an upper insulating sheet to form a pair of divided upper wirings connected with the upper wiring, an upper groove being formed between the divided upper wirings;

arranging the wiring material on a lower insulating sheet to form a pair of divided lower wirings connected with the lower wiring, a lower groove being formed between the divided lower wirings;

putting the upper insulating sheet on the lower insulating sheet to bring the divided upper wirings into contact with the divided lower wirings, an opening being formed by combining the upper groove and the lower groove;

providing ultrasonic vibration to the upper insulating sheet just above the opening formed between the divided upper wirings to melt the upper insulating sheet by frictional heat while pushing the upper insulating sheet toward the lower insulating sheet;

deforming the upper insulating sheet melted by the frictional heat to mechanically connect the upper insulating sheet with the lower insulating sheet; and tightly bonding the divided upper wirings to the divided lower wirings while contracting the upper insulating sheet melted by the frictional heat.

8. A method according to claim 7 in which the step of arranging the wiring material on an upper insulating sheet includes:

arranging an upper thermo-plastic film on the upper insulating sheet; and arranging the wiring material on the upper thermo-plastic film to form the divided upper wirings, and the step of arranging the wiring material on a lower insulating sheet include:

arranging a lower thermo-plastic film on the lower insulating sheet; and arranging the wiring material on the lower thermo-plastic film to form the divided lower wirings, and the step of deforming the upper insulating sheet includes:

melting the upper thermo-plastic film to tightly bond the upper wirings to the upper thermo-plastic resin film; and melting the lower thermo-plastic film to tightly bond the lower wirings to the lower thermo-plastic resin film.

9. A method according to claim 7 in which the step of providing ultrasonic vibration includes pressing the upper insulating sheet just above the opening with a flat surface of a column type of ultrasonic vibration horn which generates ultrasonic waves to provide the ultrasonic vibration to the upper insulating sheet.

10. A method according to claim 7 in which the step of providing ultrasonic vibration includes pressing the upper insulating sheet just above the opening with an ultrasonic vibration horn which generates ultrasonic waves to provide the ultrasonic vibration to the upper insulating sheet, the ultrasonic vibration horn laterally extending and being projected in a V shape.

11. A method for electrically connecting an upper wiring with a lower wiring, comprising the steps of:

coating a pattern of lower wirings having thermo-softening property on a lower wiring base, the lower wiring being arranged in parallel with one another at a regular pitch, and the lower wiring base being flexible;

coating a pattern of upper wirings arranged in parallel with one another at the regular pitch on an upper wiring base;

coating an insulating film on the upper wiring base and/or the lower wiring base, the insulating film being formed of thermo-plastic resin;

arranging the upper wiring base on the lower wiring base so as to align the upper wirings drawn on the upper wiring base with the lower wirings drawn on the lower wiring base, the upper wirings and the lower wirings facing each other through the insulating film;

mounting the upper and lower wiring bases on a stiff type of supporting base so as to bring the lower wiring base into contact with a large number of projections provided on the supporting base;

applying an ultrasonic vibration horn which generates ultrasonic waves on the upper wiring base to press the upper and lower wiring bases toward the supporting base, the ultrasonic vibration horn having a flat surface;

heating the lower wirings and the insulating film with frictional heat generated by the ultrasonic waves provided from the ultrasonic vibration horn to melt the insulating film and the lower wirings;

bending the lower wiring base and the lower wirings with the projections of the supporting base while pressing the upper and lower wiring bases with the ultrasonic vibration horn;

breaking through the insulating film melt by the frictional heat with the lower wirings bent by the projections to bring the lower wirings into contact with the upper wirings; and cooling and hardening the lower wirings and the insulating film by taking off the ultrasonic vibration horn from the upper wiring base to mechanically connect the upper and lower wiring bases with each other through the insulating film and to electrically connect the upper and lower wirings with each other.

12. A method according to claim 11 in which the step of mounting the upper and lower wiring bases includes arranging the projections of the supporting base at a square pitch, the pitch between the projections ranging from 0.05 mm to 2.0 mm, and the regular pitch at which the lower wirings and the upper wirings are arranged ranges from 0.3 mm to 2.0 mm.

13. A method according to claim 12 in which the step of mounting the upper and lower wiring bases includes arranging the projections on the supporting base to make an angle between the direction of a series of projections arranged in a line and the direction of extending the upper and lower wirings.

14. A method according to claim 13 in which the angle between the direction of a series of projections and the direction of extending the upper and lower wirings is 22.5 degrees.

15. A method according to claim 11 in which the upper wiring base is made of a stiff type of wiring board.

16. A method according to claim 11 in which the upper and lower wiring bases are respectively made of a flexible printed wiring sheet.

17. A method according to claim 12 in which the flexible printed wiring sheet is formed of high polymer film such as polyester and polyimide.

18. A method according to claim 11 in which the step of coating an insulating film includes:

dispersing conductive powder into the thermo-plastic resin to make insulating material on condition that the upper and/or lower wirings positioned far from each other are insulated from each other; and coating the insulating material on the upper wiring base and/or the lower wiring base to form the insulating film.

19. A method according to claim 11 in which the step of arranging the upper wiring base includes:

transferring both the upper and lower wiring bases to an image recognition device; and aligning the upper wirings coated on the upper wiring base with the lower wirings coated on the lower wiring base according to an image recognition processing.

20. A method according to claim 11 in which the step of coating an insulating film includes:

dispersing the thermo-plastic resin selected from the group consisting of polyester resin, polyvinyl chloride resin, polyvinyl acetate resin, copolymer of ethylene-vinyl acetate, polyurethane resin, polystyrene resin, and phenoxy resin into plasticizer or organic solvent selected from the group consisting of such as isophorone, carbinol, cyclohexane, and di-butyl-phthalate; and printing the thermo-plastic resin on the upper wiring base and/or the lower wiring base to coat the insulating film.

21. A method according to claim 20 in which the step of dispersing the thermo-plastic resin includes:

adding extender pigment or coloring agent such as titanium oxide, silica, talc, and copper phthalocyanine blue to the thermo-plastic resin; and adding one or more types of rubber selected from the group consisting of such as chloroprene rubber, acrylonitrile rubber, styrene butadiene rubber, and natural rubber to the thermo-plastic resin.

22. A method according to claim 11 in which frequencies of the ultrasonic waves generated by the ultrasonic vibration horn range from 10 kHz to 45 kHz.

* * * * *